(12) United States Patent
Chang et al.

(10) Patent No.: US 12,094,951 B1
(45) Date of Patent: Sep. 17, 2024

(54) CAPPING STRUCTURES IN SEMICONDUCTOR DEVICES

(71) Applicant: Taiwan Semiconductor Manufacturing Co., Ltd., Hsinchu (TW)

(72) Inventors: Po-Chin Chang, Taichung (TW); Ming-Huan Tsai, Zhibei (TW); Li-Te Lin, Hsinchu (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/136,493

(22) Filed: Apr. 19, 2023

Related U.S. Application Data

(63) Continuation of application No. 17/238,968, filed on Apr. 23, 2021, now Pat. No. 11,652,152.

(51) Int. Cl.
| | |
|---|---|
| *H01L 29/49* | (2006.01) |
| *H01L 21/8234* | (2006.01) |
| *H01L 29/08* | (2006.01) |
| *H01L 29/40* | (2006.01) |
| *H01L 29/417* | (2006.01) |
| *H01L 29/66* | (2006.01) |
| *H01L 29/78* | (2006.01) |

(52) U.S. Cl.
CPC .. *H01L 29/4983* (2013.01); *H01L 21/823431* (2013.01); *H01L 21/823475* (2013.01); *H01L 29/0847* (2013.01); *H01L 29/401* (2013.01); *H01L 29/41791* (2013.01); *H01L 29/66795* (2013.01); *H01L 29/7851* (2013.01)

(58) Field of Classification Search
CPC ......... H01L 29/4983; H01L 21/823431; H01L 21/823475; H01L 29/0847; H01L 29/401; H01L 29/41791; H01L 29/66795; H01L 29/7851

See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |

(Continued)

*Primary Examiner* — Earl N Taylor
(74) *Attorney, Agent, or Firm* — Sterne, Kessler, Goldstein & Fox P.L.L.C.

(57) ABSTRACT

A semiconductor device and methods of fabricating the same are disclosed. The method can include forming a fin structure on a substrate, forming a source/drain (S/D) region on the fin structure, forming a gate structure on the fin structure adjacent to the S/D region, and forming a capping structure on the gate structure. The forming the capping structure includes forming a conductive cap on the gate structure, forming a cap liner on the conductive cap, and forming a carbon-based cap on the cap liner. The method further includes forming a first contact structure on the S/D region, forming an insulating cap on the first contact structure, and forming a second contact structure on the conductive cap.

20 Claims, 38 Drawing Sheets

(56) References Cited

U.S. PATENT DOCUMENTS

| | | | |
|---|---|---|---|
| 9,576,814 B2 | 2/2017 | Wu et al. | |
| 9,831,183 B2 | 11/2017 | Lin et al. | |
| 9,859,386 B2 | 1/2018 | Ho et al. | |
| 10,050,114 B2 * | 8/2018 | Lee | H01L 29/45 |
| 2017/0186849 A1 * | 6/2017 | Chen | H01L 21/76883 |
| 2022/0037510 A1 * | 2/2022 | Cheng | H01L 29/785 |
| 2022/0254927 A1 * | 8/2022 | Cheng | H01L 21/76895 |
| 2022/0344486 A1 * | 10/2022 | Chang | H01L 29/0847 |

\* cited by examiner

CAPPING STRUCTURES IN SEMICONDUCTOR DEVICES

CROSS-REFERENCE TO RELATED APPLICATION

This application is a continuation of U.S. patent application Ser. No. 17/238,968, titled "Capping Structures in Semiconductor Devices," filed Apr. 23, 2021, which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Figure 1A:
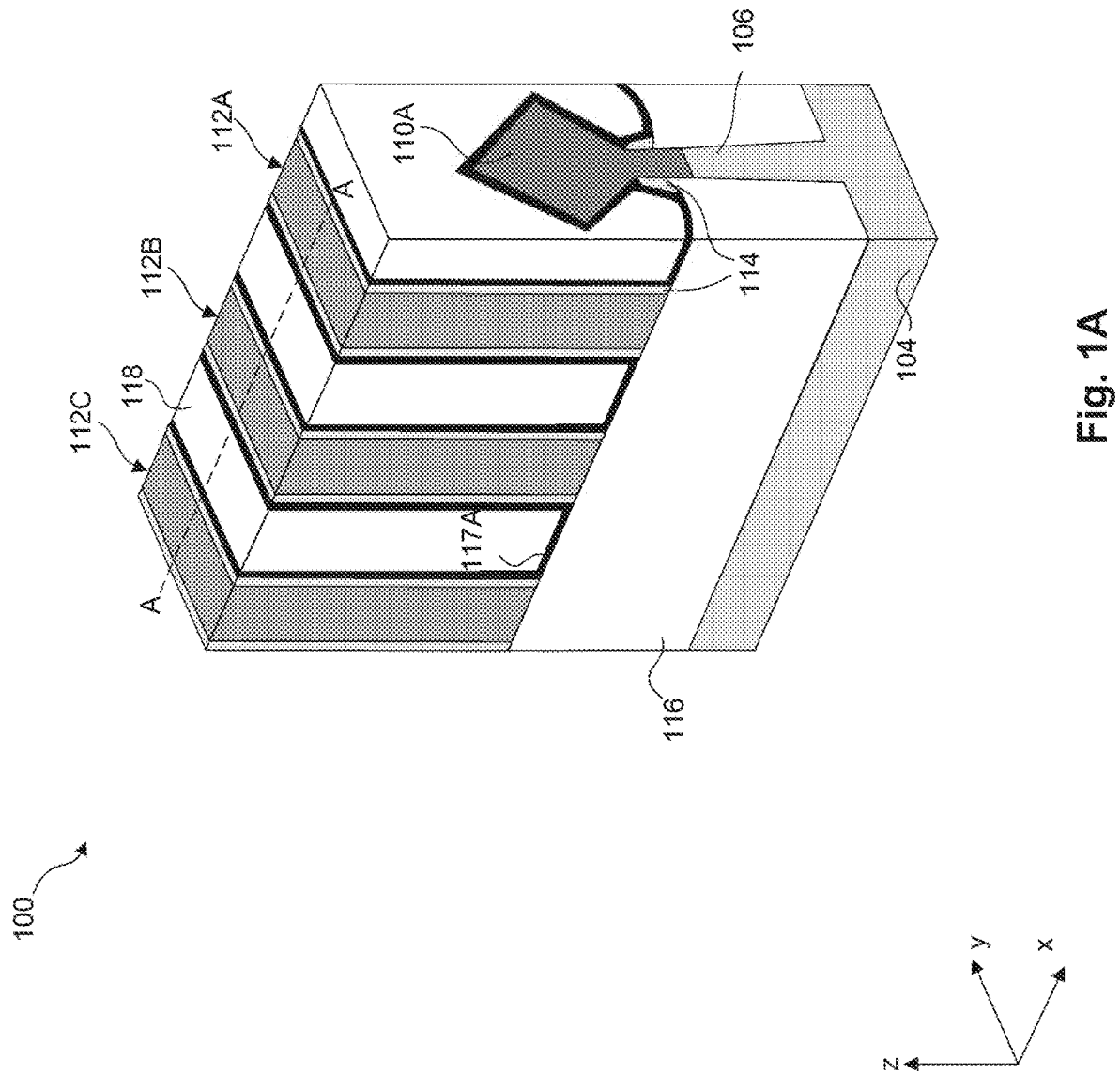
FIGS. 1A and 1D illustrate isometric views of a semiconductor device, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used heroin may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices (e.g., finFETs, gate-all-around (GAA) FETs, and/or MOSFETs) with source/drain (S/D) and gate capping structures that facilitate the alignment of vias and contact structures on S/D regions and gate structures. Further, the present disclosure provides example methods of selectively forming the vias and contact structures on S/D regions and gate structures through the S/D and gate capping structures with minimal or no misalignment. Since the vias on S/D regions and contact structures on gate structures can be adjacent to each other, misalignment of the vias and/or contact structures can result in undesirable parasitic capacitances and/or electrical short between the vias, the contact structures, and/or the gate structures.

In some embodiments, the S/D and gate capping structures are formed with different materials that have ultra-high etch selectivity with respect to each other in wet or dry etching processes. In some embodiments, the S/D capping structures can include nitrides or oxides and the gate capping structures can include carbon-based materials (e.g., carbides or oxycarbides). In some embodiments, the etching processes can be optimized for carbide to nitride or oxide etch selectivity ranging from about 40 to about 70. The ultra-high carbide to nitride or oxide etch selectivity can prevent or minimize etching of adjacent S/D capping structures during the formation of contact structures through the gate capping structures. As a result, the contact structures can be formed with minimal or no misalignment on the gate structures.

Figure 1B:
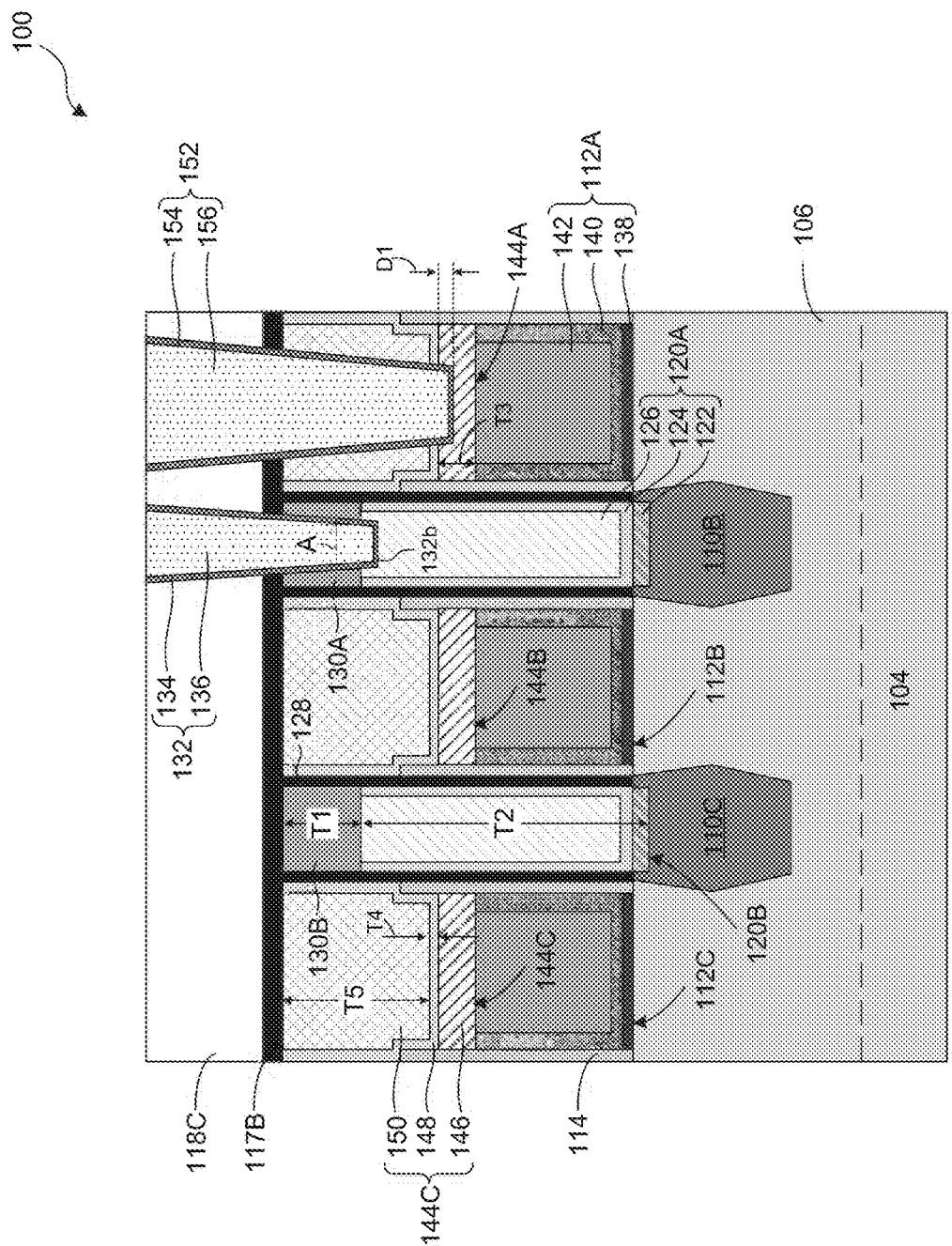
FIGS. 1B-1C illustrate cross-sectional views of a semiconductor device with source/drain (S/D) and gate capping structures, in accordance with some embodiments.
Figure 1C:
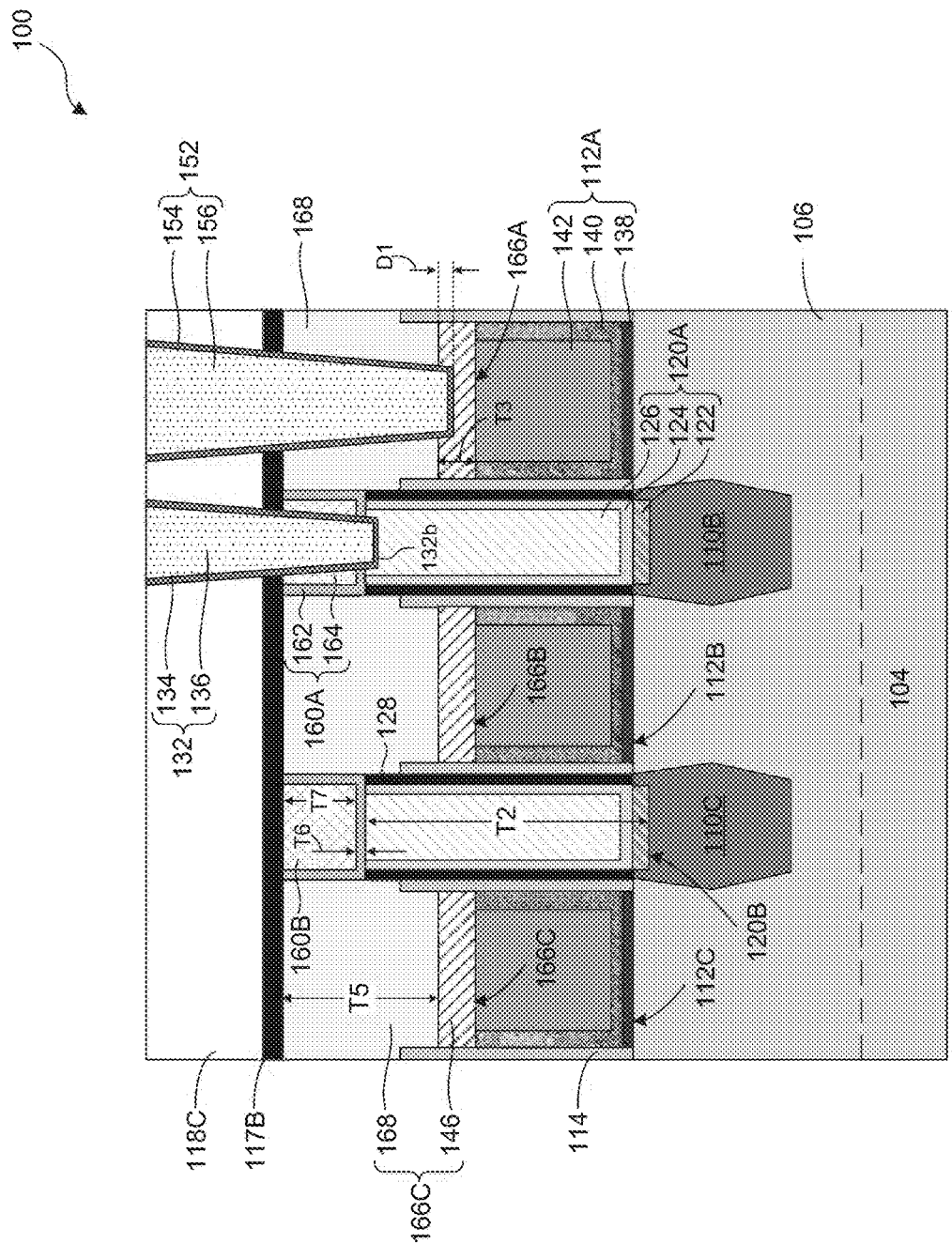

FIG. 1A illustrates an isometric view of a FET 100, according to some embodiments. FET 100 can have different cross-sectional views, as illustrated in FIGS. 1B-1C, according to some embodiments. FIGS. 1B-1C illustrate cross-sectional views of FET 100 along line A-A with additional structures that are not shown in FIG. 1A for simplicity. The discussion of elements in FIGS. 1A-1C with the same annotations applies to each other, unless mentioned otherwise. In some embodiments, FET 100 can represent n-type FET 100 (NFET 100) or p-type FET 100 (PFET 100) and the discussion of FET 100 applies to both NFET 100 and PFET 100, unless mentioned otherwise.

Referring to FIG. 1A, FET 100 can include an array of gate structures 112A-112C disposed on a fin structure 106 and an array of S/D regions 110A-110C (S/D region 110A visible in FIG. 1A; 110B-110C visible in FIGS. 1B-1C) disposed on portions of fin structure 106 that are not covered by gate structures 112A-112C. FET 100 can further include gate spacers 114, shallow trench isolation (STI) regions 116, etch stop layers (ESLs) 117A-117B (ESL 117A not shown in FIGS. 1B-1C for simplicity; ESL 117B not shown in FIG. 1A for simplicity, shown in FIG. 1B), and interlayer dielectric (ILD) layers 118A-118C (ILD layers 118B-118C not shown in FIG. 1A for simplicity). ILD layer 118A can be disposed on ESL 117A. In some embodiments, gate spacers 114, STI regions 116, ESLs 117A-117B, and ILD layers 118A-118C can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112A-112C from adjacent structures.

FET 100 can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structure 106 can include a material similar to substrate 104 and extend along an X-axis.

Referring to FIG. 1B, FET 100 can include S/D regions 110B-110C, S/D contact structures 120A-120B disposed on respective S/D region 110B-110C, diffusion barrier layers 128, S/D capping structures 130A-130B disposed on respective S/D contact structures 120A-120B, via 132 disposed on S/D contact structure 120A through S/D capping structure 130A, gate structures 112A-112C disposed on fin structure 106, gate capping structures 144A-144C disposed on respective gate structures 112A-112C, and gate contact structure 152 disposed on gate structure 112A through gate capping structure 144A. The discussion of S/D regions 110A-11C applies to each other and the discussion of gate structures 112A-112C applies to each other, unless mentioned otherwise. In some embodiments, via similar to via 132 can be disposed on S/D contact structure 120B and gate contact structures similar to gate contact structure 152 can be disposed on gate structures 112B-112C, but may not be visible in the cross-sectional view of FIG. 1B. In some embodiments, S/D regions 110C and/or gate structures 112B-112C may not be electrically connected to other elements of FET 100 through vias and contact structures.

For NFET 100, each of S/D regions 110B-110C can include an epitaxially-grown semiconductor material, such as Si, and n-type dopants, such as phosphorus and other suitable n-type dopants. For PFET 100, each of S/D regions 110B-110C can include an epitaxially-grown semiconductor material, such as Si and SiGe, and p-type dopants, such as boron and other suitable p-type dopants. In some embodiments, each of S/D contact structures 120A-120B can include (i) a silicide layer 122 disposed within each of S/D regions 110B-110C, (ii) an adhesion layer 124 disposed on silicide layer 122, and (iii) a contact plug 126 disposed on adhesion layer 124.

In some embodiments, for NFET 100, silicide layers 122 can include a metal or a metal silicide with a work function value closer to a conduction band-edge energy than a valence band-edge energy of the material of S/D regions 110B-110C. For example, the metal or the metal silicide can have a work function value less than 4.5 eV (e.g., about 3.5 eV to about 4.4 eV), which can be closer to the conduction band energy (e.g., 4.1 eV for Si) than the valence band energy (e.g., 5.2 eV for Si) of Si-based material of S/D regions 110B-110C. In some embodiments, for NFET 100, the metal silicide of silicide layers 122 can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), other suitable metal silicide materials, or a combination thereof.

In some embodiments, for PFET 100, silicide layers 122 can include a metal or a metal silicide with a work function value closer to a valence band-edge energy than a conduction band-edge energy of the material of S/D regions 110B-110C. For example, the metal or the metal silicide can have a work function value greater than 4.5 eV (e.g., about 4.5 eV to about 5.5 eV), which can be closer to the valence band energy (e.g., 5.2 eV for Si) than the conduction band energy (e.g., 4.1 eV for Si) of Si-based material of S/D regions 110B-110C. In some embodiments, for PFET 100, the metal silicide of silicide layers 122 can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof.

Adhesion layers 124 can aid in the formation of contact plugs 126 without voids and can include a metal nitride, such as titanium nitride (TiN), tantalum nitride (TaN), and other suitable metal nitride materials. In some embodiments, each of adhesion layers 124 can include a single layer of metal nitride or can include a stack of metal layer and metal nitride layer. The metal layer can be disposed on silicide layer 122 and metal nitride layer can be disposed on the metal layer. In some embodiments, the metal layer can include Ti, Ta, or other suitable metals and can include the same metal as the metal nitride layer.

Contact plugs 126 can include conductive materials with low resistivity (e.g., resistivity about 50 $\mu\Omega$-cm, about 40 $\mu\Omega$-cm, about 30 $\mu\Omega$-cm, about 20 $\mu\Omega$-cm, or about 10 $\mu\Omega$-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof. Diffusion barrier layers 128 can prevent the oxidation of contact plugs 126 by preventing the diffusion of oxygen atoms from ILD layer 118B (not visible in the cross-sectional view of FIG. 1B) and/or from gate capping structures 140A-140C to contact plugs 126. In some embodiments, diffusion barrier layers 128 can include a dielectric nitride, such as silicon nitride ($Si_xN_y$), silicon oxynitride (SiON), silicon carbon nitride (SiCN), and other suitable dielectric nitride materials.

In some embodiments, each of S/D capping structures 130A-130B can include an insulating cap with (i) a nitride material, such as $Si_xN_y$, titanium nitride ($Ti_xN_y$), tantalum nitride ($Ta_xN_y$), and other suitable nitride materials, (ii) an oxide material, such silicon oxide ($Si_xO_y$) and other suitable oxide materials, or (ii) an oxynitride material, such as silicon oxynitride ($Si_xO_yN_z$) and other suitable oxynitride materials. In some embodiments, S/D capping structures 130A-130B can include a diffusion barrier layer (not shown) between S/D capping structures 130A-130B and S/D contact structures 120A-120B when the insulating cap includes an oxide or oxynitride material. The diffusion barrier layer can prevent the oxidation of S/D contact structures 120A-120B by the diffusion of oxygen atoms from S/D capping structures 130A-130B.

Figure 22:
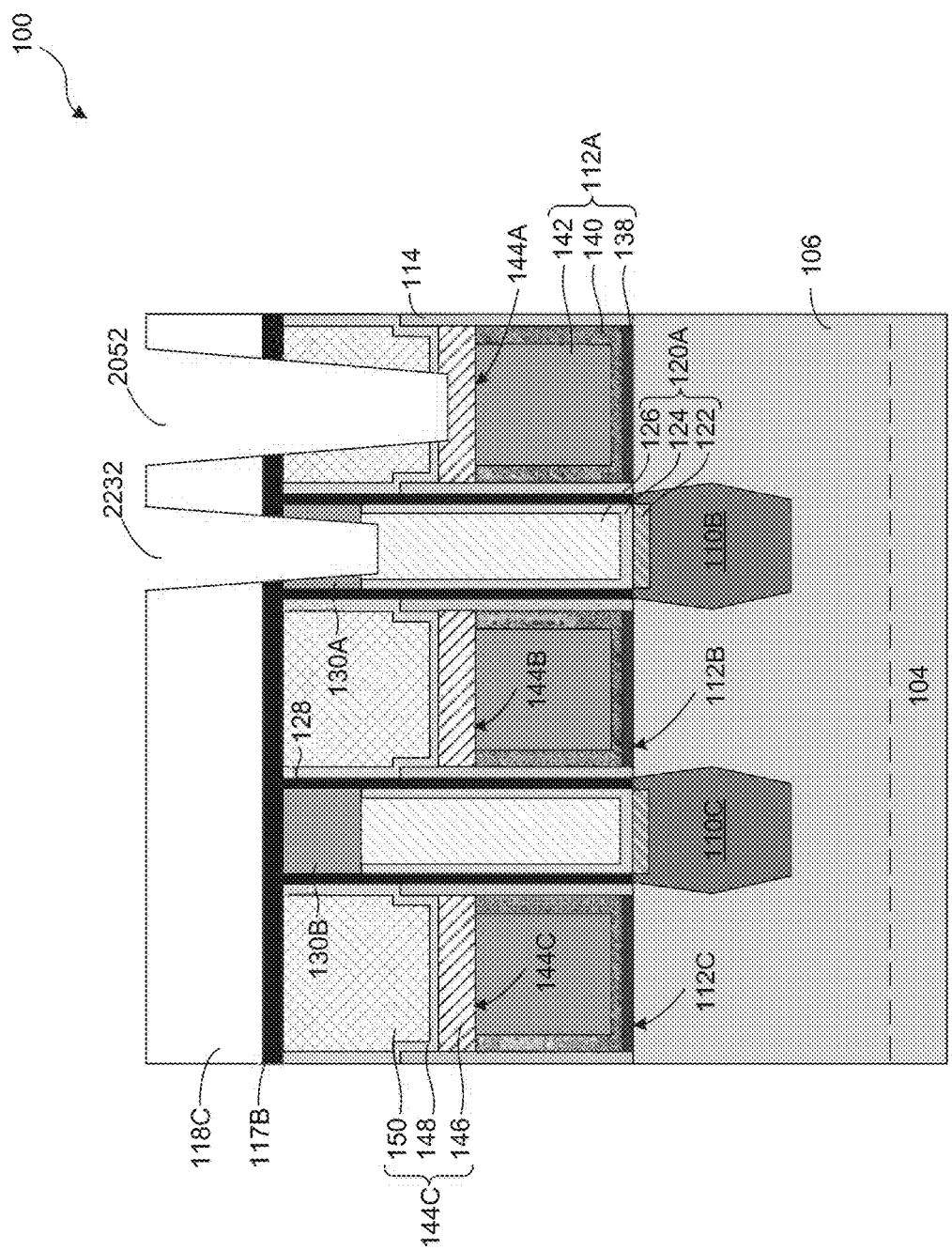

S/D capping structures 130A-130B can control the etch profile of via opening 2232, described below with reference to FIG. 22, during the formation of via 130. In addition, S/D capping structures 130A-130B can protect the underlying S/D contact structures 120A-120B from structural and/or compositional degradation during subsequent processing of the semiconductor device. In some embodiments, each of S/D capping structures 130A-130B can have a thickness T1 ranging from about 1 nm to about 15 nm for adequately controlling the etch profile of via opening 2232 and/or for adequately protecting the underlying S/D contact structures 120A-120B without compromising thickness T2 of S/D contact structures 120A-120B. In some embodiments, a ratio between thicknesses T1 and T2 (i.e., T1:T2) can range from about 1:5 to about 1:100.

In some embodiments, S/D capping structures 130A-130B can include conductive material and via 132 may not extend into S/D contact structure 120A, as shown in FIG. 1B. Instead, bottom surface 132b of via 132 may extend into S/D capping structure 130A up to dotted line A shown in FIG. 1B. The conductive material of S/D capping structure 130A can provide a conductive interface between S/D contact structure 120A and via 132. The conductive interface can electrically connect S/D contact structure 120A to via 132 without forming via 132 directly on or within S/D contact structure 120A. Forming via 132 up to dotted line A can prevent contamination of S/D contact structure 120A from any of the processing materials used in the formation of via 132, which is described in detail below.

S/D contact structure 120A can electrically connect to overlying interconnect structures (not shown), power supplies (not shown), and/or other elements of FET 100 through via 132. Via 132 can include a liner 134 and a contact plug 136 disposed on liner 134. In some embodiments, liner 134 can include a nitride material, such as TiN, and contact plug 136 can include a conductive material, such as Ru, Co, Ni, Al, Mo, W, Ir, Os, Cu, and Pt. In some embodiments, liner 134 can include a dual layer of Ti and TiN and contact plug 136 can include W. In some embodiments, liner 134 can include TaN and contact plug 136 can include Ru. In some embodiments, contact plug 136 can be formed by a bottom-up approach, and via 132 can be formed without liner 134. In some embodiments, via 132 can be formed using a precursor gas of tungsten hexafluoride ($WF_6$), and as a result, via 132 can include tungsten with impurities of fluorine atoms. The concentration of fluorine atom impurities in via 132 can range from about 1 atomic percent to about 10 atomic percent of the total concentration of atoms in via 132. In some embodiments, bottom surface 132b of via 132 can have a curved profile to increase the contact area between via 132 and contact plug 126, and consequently decrease the contact resistance between via 132 and contact plug 126. In some embodiments, via 132 can have a diameter (or a width) along an X-axis ranging from about 10 nm to about 20 nm to provide an optimal contact area between S/D contact structure 120A and overlying interconnect structures (not shown) without compromising device size and manufacturing cost.

Each of gate structures 112A-112C can include (i) an interfacial oxide (IO) layer 138 disposed on fin structure 106, (ii) a high-k (HK) gate dielectric layer 140 disposed on IO layer 138, (iii) a gate metal fill layer 142 disposed on HK gate dielectric layer 140.

In some embodiments, IO layer 138 can include $SiO_2$, silicon germanium oxide ($SiGeO_x$), germanium oxide ($GeO_x$), or other suitable oxide materials. In some embodiments, HK gate dielectric layer 140 can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), prascodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) a combination thereof, or (iv) other suitable high-k dielectric materials. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

In some embodiments, gate metal fill layer 142 can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), other suitable conductive materials, or a combination thereof. In some embodiments, gate metal fill layer 142 can include a substantially fluorine-free metal layer (e.g., fluorine-free W). The substantially fluorine-free metal layer can include an amount of fluorine contaminants less than about 5 atomic percent in the form of ions, atoms, and/or molecules.

In some embodiments, gate structures 112A-112C can include work function metal (WFM) layers (not shown for simplicity) disposed between HK gate dielectric layers 140 and gate metal fill layers 142. For NFET 100, WFM layers can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For PFET 100, WFM layer can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), other suitable substantially Al-free conductive materials, or a combination thereof.

In some embodiments, each of gate capping structures 144A-144C can include (i) a conductive gate cap 146 disposed on HK gate dielectric layer 140 and gate metal fill layer 142, (ii) a gate cap liner 148 disposed on conductive gate cap 146, and (iii) a carbon-based gate cap 150 disposed on gate cap liner 148. In some embodiments, conductive gate cap 146 can include a metallic material, such as W, Ru, Ir, Mo, other suitable metallic materials, and a combination thereof. In some embodiments, conductive gate cap 146 can be formed using a precursor gas of tungsten pentachloride ($WCl_5$) or tungsten hexachloride ($WCl_6$), and as a result, conductive gate cap 146 can include tungsten with impurities of chlorine atoms. The concentration of chlorine atom impurities can range from about 1 atomic percent to about 10 atomic percent of the total concentration of atoms in each conductive gate cap 146.

Conductive gate cap 146 provides a conductive interface between gate structure 112A and gate contact structure 152. The conductive interface can electrically connect gate structure 112A to gate contact structure 152 without forming gate contact structure 152 directly on or within gate structure 112A. Gate contact structure 152 is not formed directly on or within gate structure 112A to prevent contamination of gate structure 112A by any of the processing materials used in the formation of gate contact structure 152, which is described in detail below. In some embodiments, conductive gate cap 146 can control the depth profile of gate contact structure 152 and prevent gate contact structure 152 from extending into gate structure 112A in addition to providing the conductive interface between gate structure 112A and gate contact structure 152. In some embodiments, conductive gate cap 146 can have a thickness T3 ranging from about 2 nm to about 20 nm and gate contact structure 152 can extend a distance D1 ranging from about 1 nm to about 10 nm into conductive gate cap 146 for adequately controlling the depth profile of gate contact structure 152. To prevent gate contact structure 152 from extending into gate structure 112A, conductive gate cap 146 is formed with thickness T3 greater than D1 and a ratio D1:T3 ranging from about 1:2 to about 1:3.

In some embodiments, growth promotion layers (not shown) can be disposed between conductive gate caps 146 and gate structures 112A-112C. The growth promotion layers can include a nitride material, such as titanium nitride (TiN), tantalum nitride (TaN), tungsten nitride (WN), molybdenum nitride (MoN), other suitable nitride materials, and a combination thereof. The growth promotion layers can provide a surface favorable for bottom up deposition of conductive gate caps 146. The bottom-up deposition process selectively deposits conductive gate caps 146 directly or indirectly on gate structures 112A-112C and prevents conductive gate caps 146 from depositing on FET structures, such as spacers 114 and ILD layer 118A, that can electrically short with subsequently-formed adjacent structures, such as S/D contact structures 120A. For adequately promoting the bottom up deposition of conductive gate caps 146, the growth promotion layers can have a thicknesses ranging from about 1 nm to about 5 nm.

In some embodiments, gate cap liners 148 can include a nitride material, such as TiN, TaN, WN, MON, other suitable nitride materials, and a combination thereof. Gate cap liners 148 can prevent the oxidation of conductive gate caps 146 during the formation of carbon-based gate caps 150. In some embodiments, gate cap liners 148 can include a thickness T4 ranging from about 2 nm to about 3 nm to adequately prevent the oxidation of conductive gate caps 146.

Figure 20:
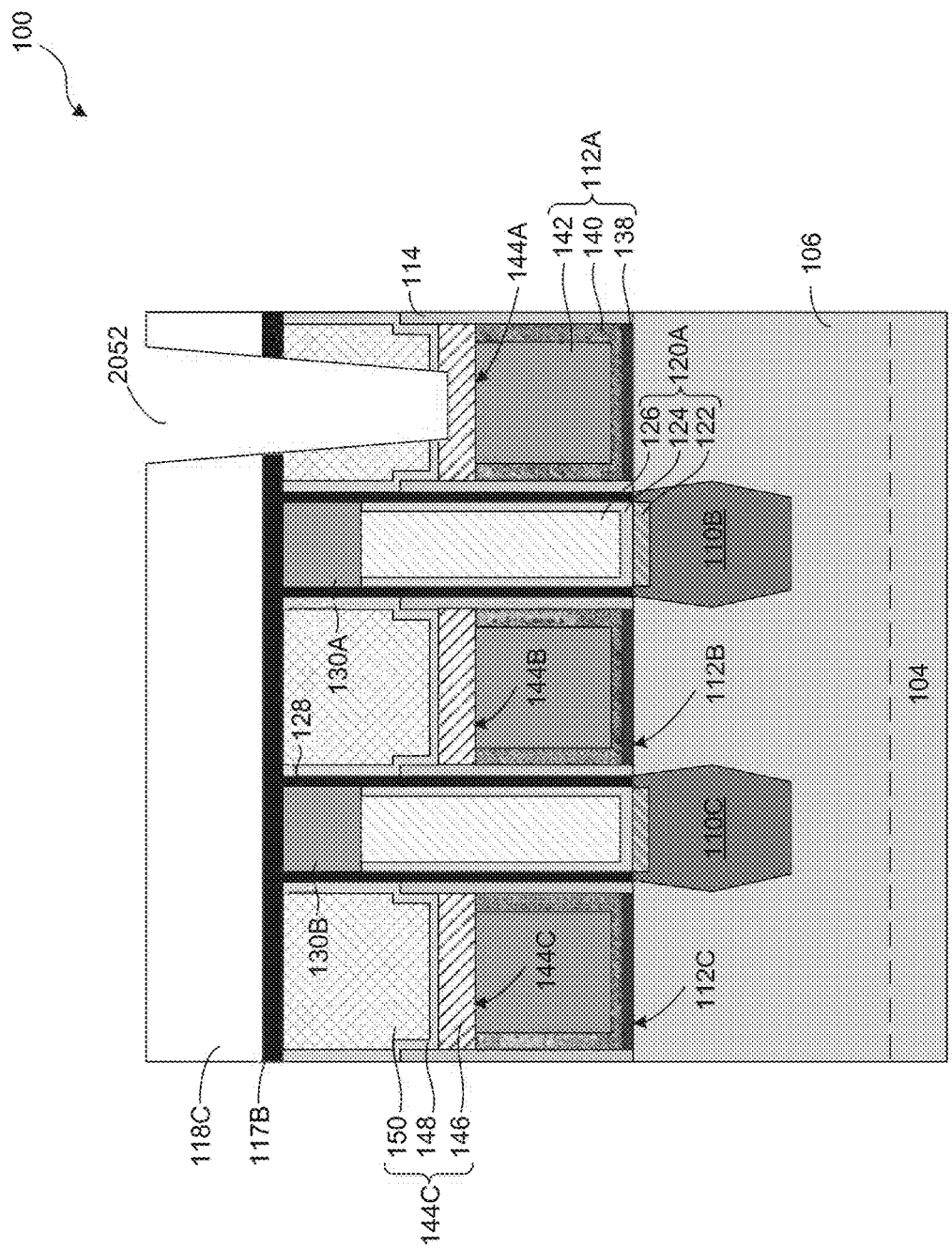

Carbon-based gate cap 150 can control the etch profile of gate contact opening 2052, described below with reference to FIG. 20, during the formation of gate contact structure 152. In addition, carbon-based gate caps 150 can protect the underlying conductive gate caps 146 and gate structures 112A-112C from structural and/or compositional degradation during subsequent processing of the semiconductor device. In some embodiments, carbon-based gate caps 150 can include a thickness T5 ranging from about 5 nm to about 30 nm for adequately controlling the etch profile of gate contact opening 2052, and adequately protecting the underlying conductive gate caps 146 and gate structures 112A-112C. In some embodiments, a ratio between thicknesses T4 and T5 (i.e., T4:T5) can range from about 1:3 to about 1:15 for gate cap liners 148 to adequately function without comprising the functionalities of carbon-based gate caps 150.

In some embodiments, carbon-based gate caps 150 include a carbon-based material (e.g., carbide or oxycarbide) with an etch selectivity higher than the etch selectivity of the non-carbon based material (e.g., nitride, oxide, or oxynitride) of S/D capping structures 130A-130B in an etching process. In an etching process, the presence of carbon atoms in carbon-based gate caps 150 provides the higher etch selectivity because the carbon atoms can form volatile carbon oxide gases (e.g., carbon monoxide (CO) or carbon dioxide ($CO_2$)) as etched byproducts faster than the etched byproducts formed from the etching of S/D capping structures 130A-130B. The greater the difference between the etch selectivities of carbon-based gate caps 150 and S/D capping structures 130A-130B in an etching process, the better the alignment of gate contact opening 2052 on conductive gate cap 146 during the formation of gate contact structure 152. In some embodiments, carbon-based gate caps 150 can include a carbide material with an etch selectivity about 40 times to about 70 times higher than the etch selectivity of the nitride, oxide, or oxynitride materials of S/D capping structures 130A-130B in a wet or dry etching process. Such high carbide to nitride, oxide, or oxynitride etch selectivity of about 40 to about 70 can prevent or minimize etching of adjacent S/D capping structure 130A during the formation of gate contact structure 152. As a result, gate contact structure 152 can be formed with minimal or no misalignment on conductive gate cap 146.

In some embodiments, carbon-based gate caps 150 can include silicon carbide (SiC), silicon oxycarbide (SiOC), tungsten carbide (WC), titanium carbide (TiC), other suitable carbide materials, or a combination thereof. The carbon atom concentration in carbon-based gate cap 150 can range from about 30 atomic % to about 50 atomic %. The carbon atom concentration in carbon-based gate cap 150 is greater than the concentrations of oxygen and/or nitrogen atoms if carbon-based gate caps 150 include a material with oxygen and/or nitrogen atoms.

Gate contact structure 152 can include a liner 154 and a contact plug 156 disposed on liner 154. In some embodiments, liner 154 can include a nitride material, such as TiN, and contact plug 156 can include a conductive material similar to via 132. In some embodiments, liner 154 can include a dual layer of Ti and TiN and contact plug 156 can include W. In some embodiments, liner 154 can include TaN and contact plug 156 can include Ru.

Referring to FIG. 1C, in some embodiments, FET 100 can include S/D capping structures 160A-160B and gate capping structures 166A-166C instead of S/D capping structures 130A-130B and gate capping structures 144A-144C, respectively.

In some embodiments, each of gate capping structures 166A-166C can include (i) a gate insulating cap 168, and (ii) conductive gate cap 146. Gate insulating cap 168 can include (i) a nitride material, such as $Si_xN_y$, $Ti_xN_y$, $Ta_xN_y$, and other suitable nitride materials, (ii) an oxide material, such $Si_xO_y$, and other suitable oxide materials, or (ii) an oxynitride material, such as $Si_xO_yN_z$ and other suitable oxynitride materials. In some embodiments, gate capping structures 166A-166C can include a diffusion barrier layer (not shown) similar to gate cap liners 148 between gate insulating cap 168 and conductive gate cap 146 when gate insulating cap 168 includes an oxide or oxynitride material. The diffusion barrier layer can prevent the oxidation of conductive gate cap 146 by the diffusion of oxygen atoms from gate insulating cap 168.

Figure 34:
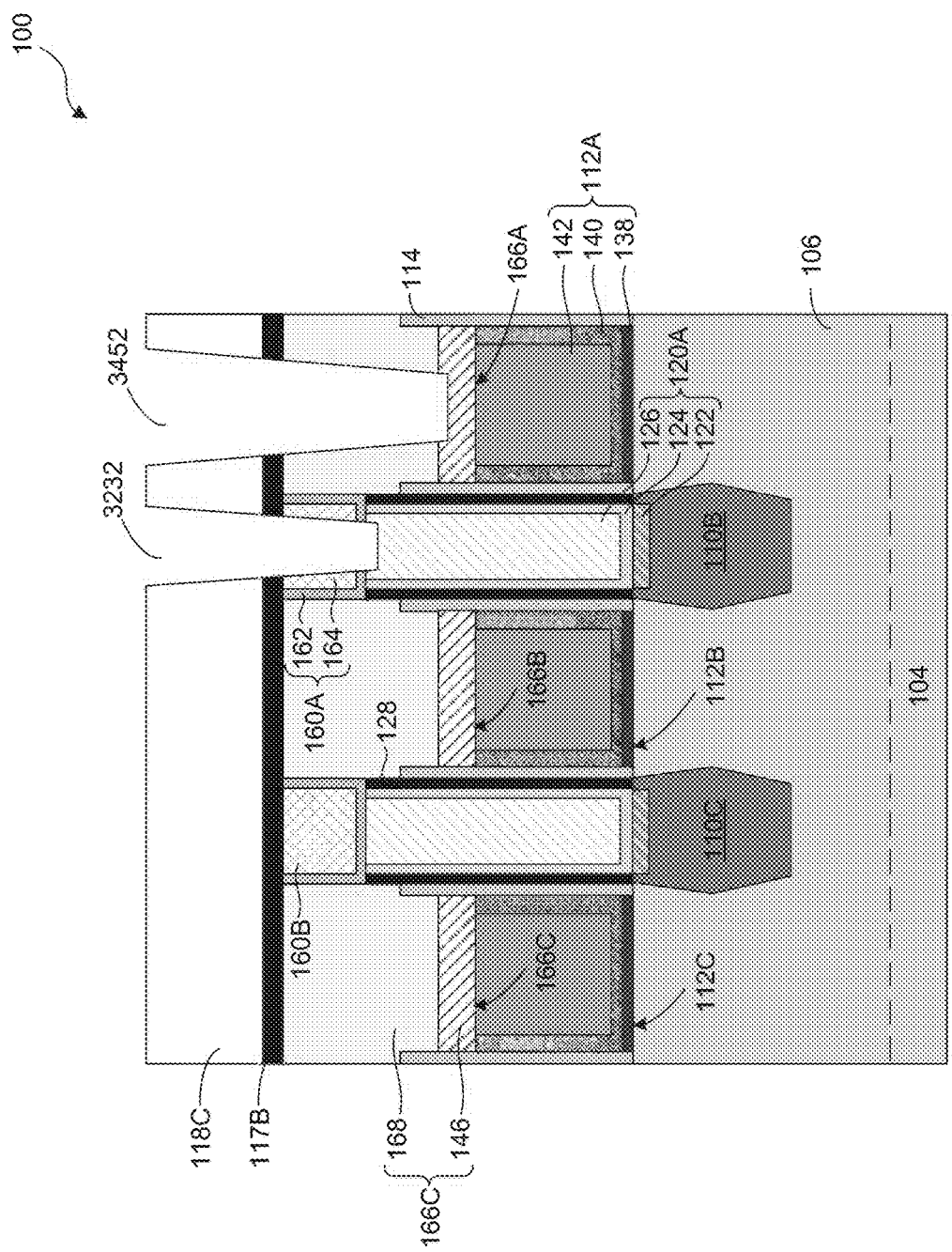

Gate insulating cap 168 can control the etch profile of gate contact opening 3454, described below with reference to FIG. 34, during the formation of gate contact structure 152. In addition, gate insulating caps 168 can protect the underlying structures from structural and/or compositional degradation during subsequent processing of the semiconductor device. In some embodiments, gate insulating caps 168 can include a thickness T5 ranging from about 5 nm to about 30 nm for adequately controlling the etch profile of gate contact opening 3452, and adequately protecting the underlying conductive gate caps 146 and gate structures 112A-112C. In some embodiments, a ratio between thicknesses T3 and T5 (i.e., T3:T5) can range from about 1:3 to about 1:15 for gate insulating caps 168 to adequately function without comprising the functionalities of conductive gate caps 146.

In some embodiments, S/D capping structures 160A-160B can include (i) S/D cap liners 162 disposed on S/D contact structures 120A-120B, and (ii) carbon-based S/D caps 164 disposed on S/D cap liner 162. The discussion of gate cap liners 148 and carbon-based gate caps 150 applies to respective S/D cap liners 162 and carbon-based S/D caps 164, unless mentioned otherwise.

S/D cap liners 162 can prevent the oxidation of contact plugs 126 during the formation of carbon-based S/D caps 164. In some embodiments, S/D cap liners 162 can include a thickness T6 ranging from about 2 nm to about 3 nm to adequately prevent the oxidation of contact plugs 126. Carbon-based S/D cap 164 can control the etch profile of via opening 3232, described below with reference to FIG. 32, during the formation of via 132. In addition, carbon-based S/D caps 164 can protect the underlying S/D contact structures 120A-120B from structural and/or compositional degradation during subsequent processing of the semiconductor device. In some embodiments, carbon-based S/D caps 164 can include a thickness T7 ranging from about 5 nm to about 20 nm for adequately controlling the etch profile of via opening 3232, and adequately protecting the underlying contact plugs 126. In some embodiments, a ratio between thicknesses T6 and T7 (i.e., T6:T7) can range from about 1:3 to about 1:15 for S/D cap liners 162 to adequately function without comprising the functionalities of carbon-based S/D caps 164.

In some embodiments, carbon-based S/D caps 164 can include a carbide material with an etch selectivity about 40 times to about 70 times higher than the etch selectivity of the nitride, oxide, or oxynitride materials of gate insulating caps 168 in a wet or dry etching process. Such high carbide to nitride, oxide, or oxynitride etch selectivity of about 40 to about 70 can prevent or minimize etching of adjacent gate insulating caps 168 during the formation of via 132. As a result, via 132 can be formed with minimal or no misalignment on S/D contact structure 120A.

Figure 1D:
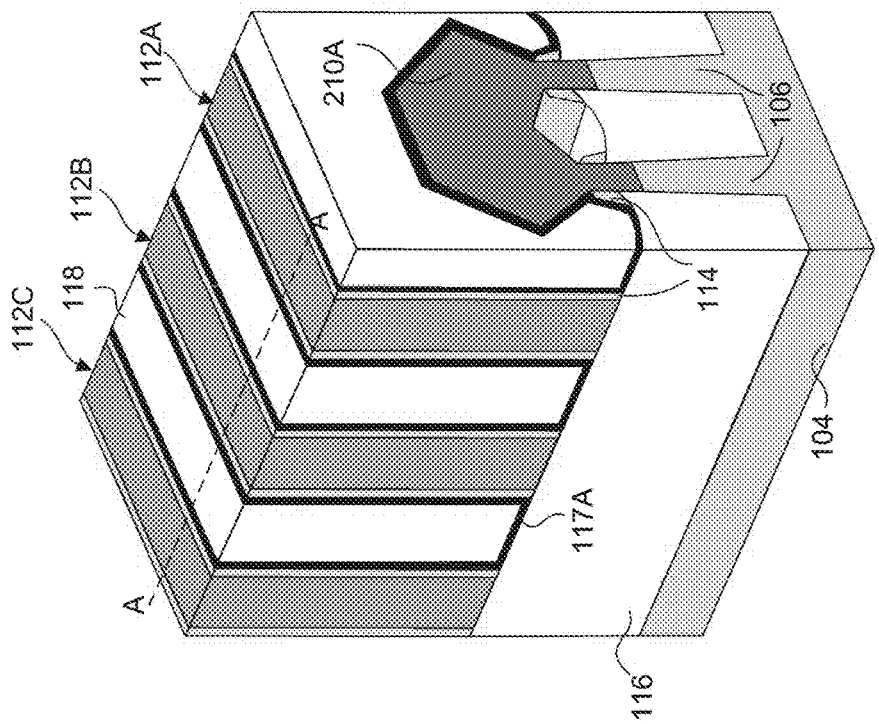

FIG. 1D illustrates another isometric view of FET 100, according to some embodiments. In some embodiments, FET 100 can have merged S/D regions 210A-210C (S/D region 210A visible in FIG. 1D; S/D regions 210B-210C underlying ILD layer 118) instead of source/drain regions 110A-110C. The discussion of S/D regions 110A-110C applies to merged S/D regions 210A-210C, unless mentioned otherwise. FET 100 of FIG. 1D can have cross-sectional views along line A-A similar to the cross-sectional views of FIGS. 1B-1C. The discussion of elements in FIGS. 1A-1D with the same annotations applies to each other, unless mentioned otherwise.

Figure 2:
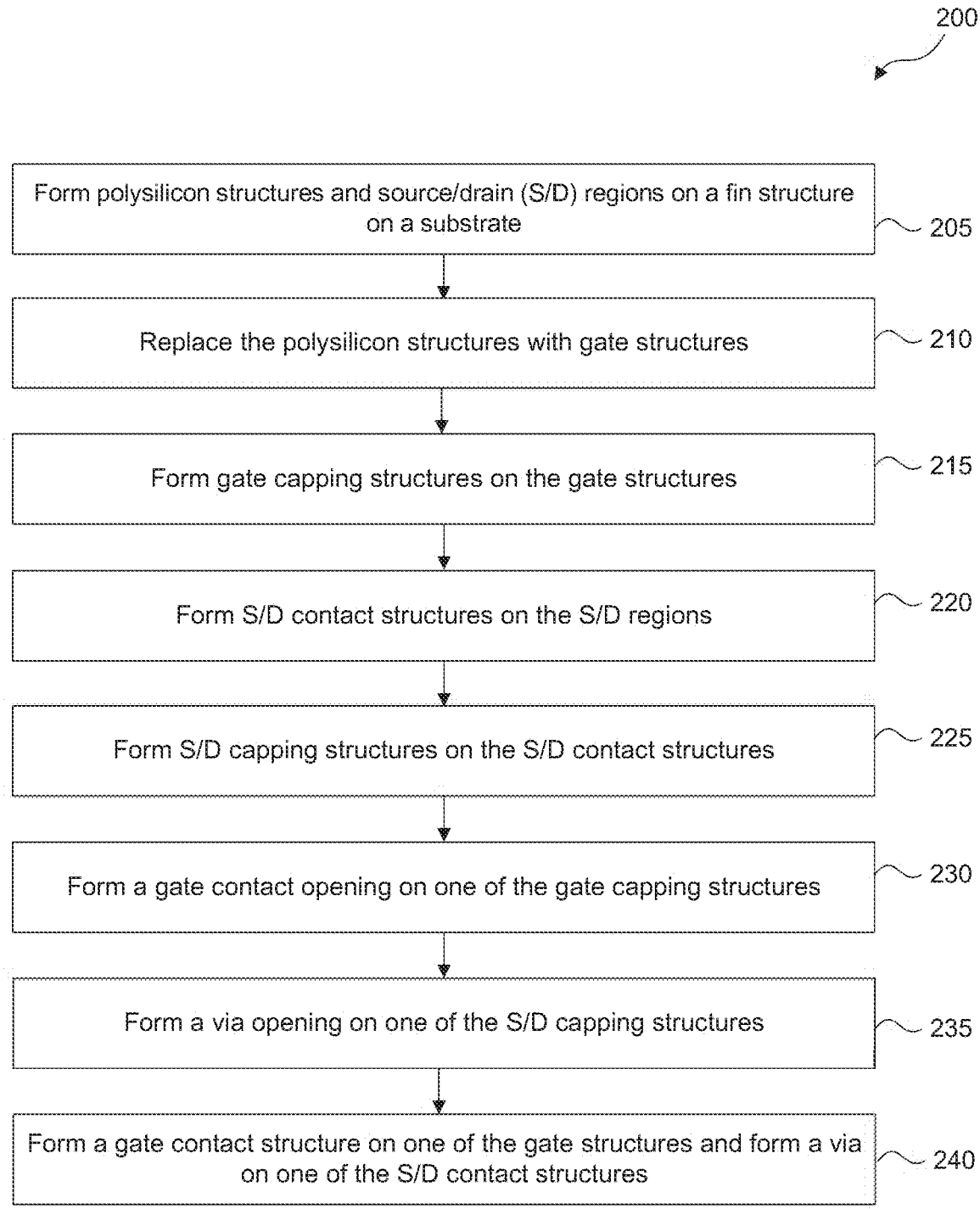
FIG. 2 is a flow diagram of a method for fabricating a semiconductor device with S/D and gate capping structures, in accordance with some embodiments.

FIG. 2 is a flow diagram of an example method 200 for fabricating FET 100 with cross-sectional view shown in FIG. 1B, according to some embodiments. For illustrative purposes, the operations illustrated in FIG. 2 will be described with reference to the example fabrication process for fabricating FET 100 as illustrated in FIGS. 3-23. FIGS. 3-23 are cross-sectional views of FET 100 along line A-A of FIG. 1A at various stages of fabrication, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3-23 with the same annotations as elements in FIGS. 1A-1B are described above.

Figure 3:
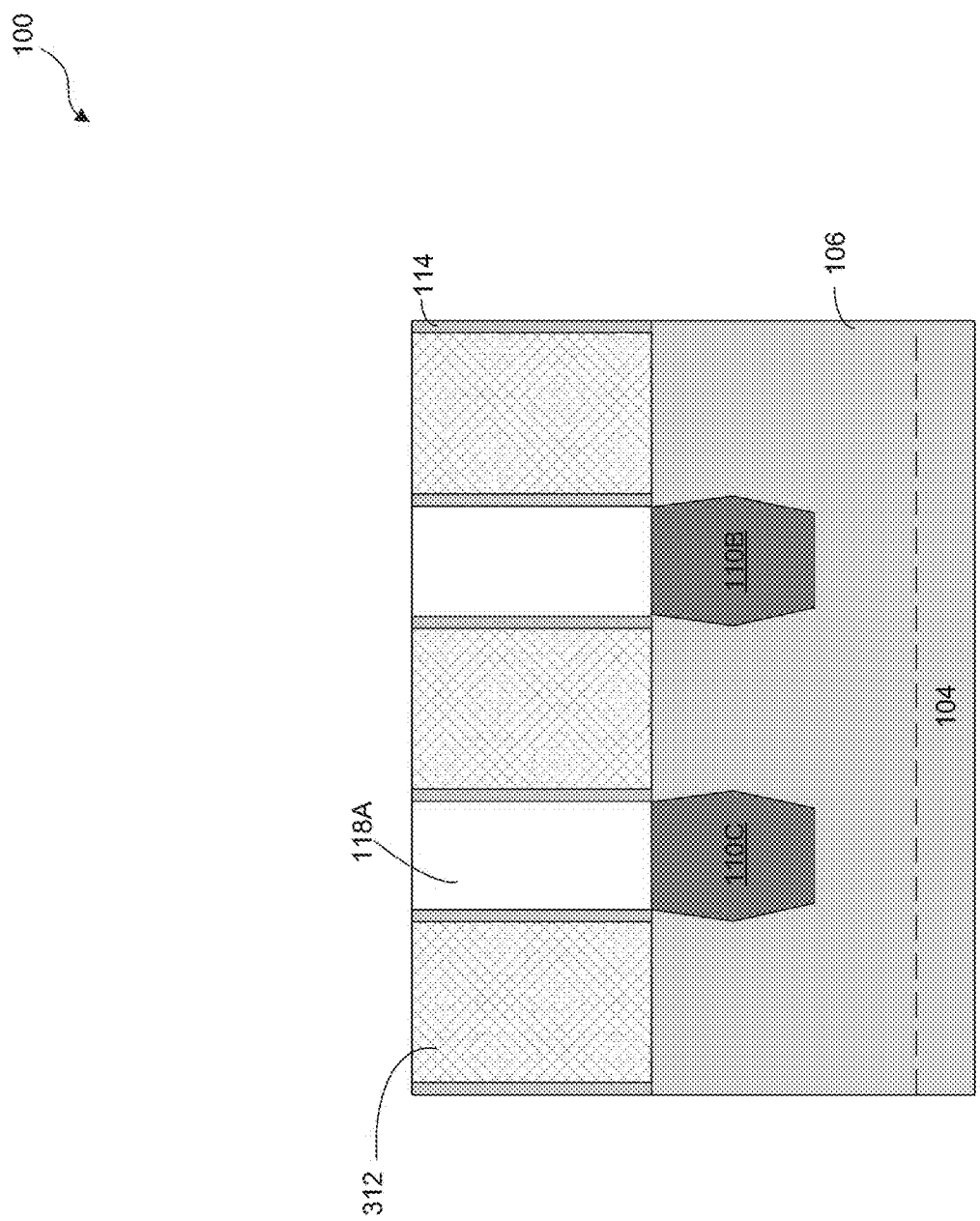
FIGS. 3-23 illustrate cross-sectional views of a semiconductor device with S/D and gate capping structures at various stages of its fabrication process, in accordance with some embodiments.
Figure 4:
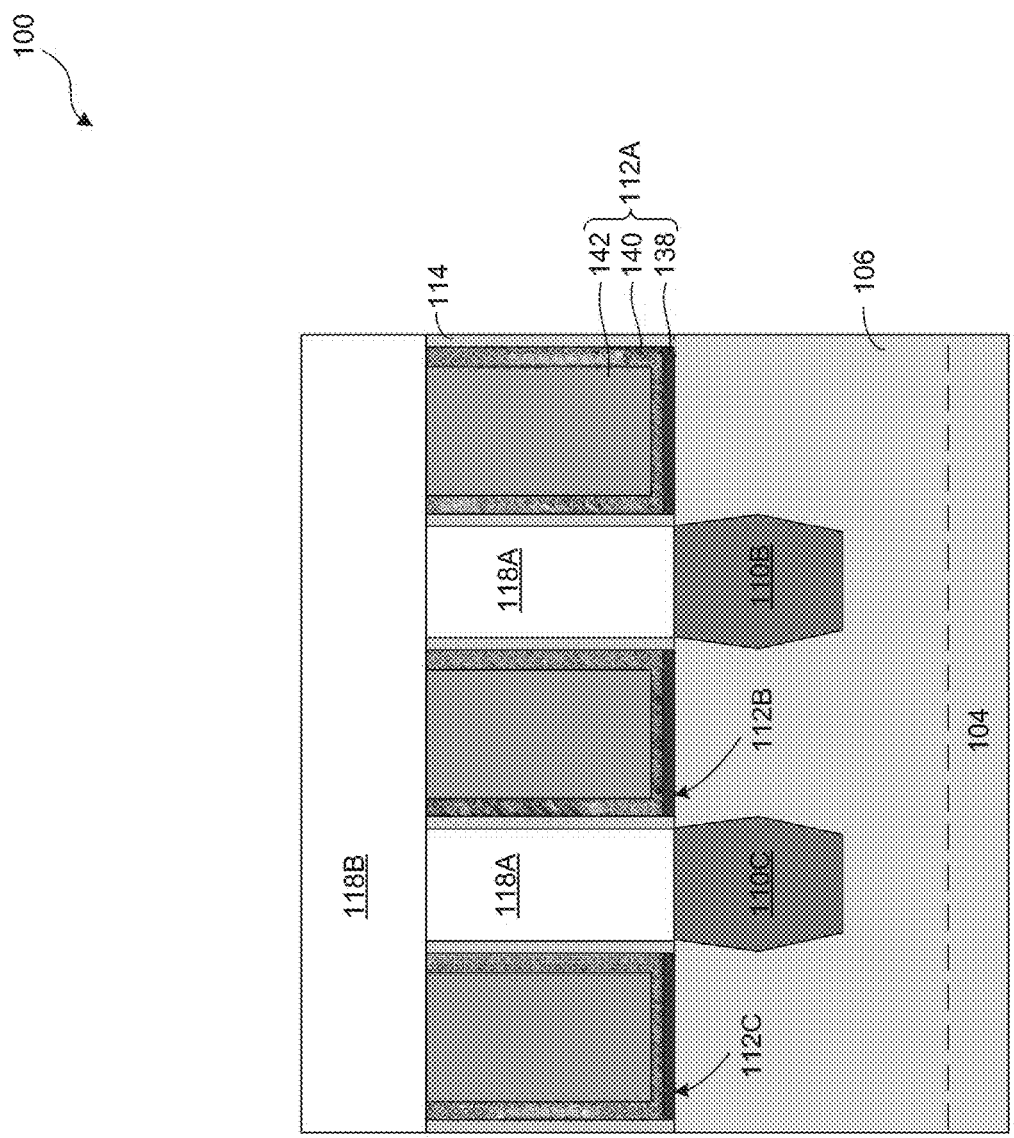

In operation 205, polysilicon structures and S/D regions are formed on a fin structure on a substrate. For example, as shown in FIG. 3, polysilicon structures 312 and S/D regions 110B-110C are formed on fin structure 106, which are formed on substrate 104. During subsequent processing, polysilicon structures 312 can be replaced in a gate replacement process to form gate structures 112A-112C. After the formation of S/D regions 110A-110C, ESL 117A (shown in FIG. 1A; not shown in FIGS. 3-27 for simplicity) and ILD layer 118A can be formed to form the structure of FIG. 3.

Referring to FIG. 2, in operation 210, polysilicon structures are replaced with gate structures. For example, as in FIG. 4, polysilicon structures 312 are replaced with gate structures 112A-112C. The formation of gate structures 112A-112C can include replacing polysilicon structures 312 with IO layers 138, HK gate dielectric layers 140, and gate metal fill layers 142. After the formation of S gate structures 112A-112C, ILD layer 118B can be formed to form the structure of FIG. 4.

Figure 5:
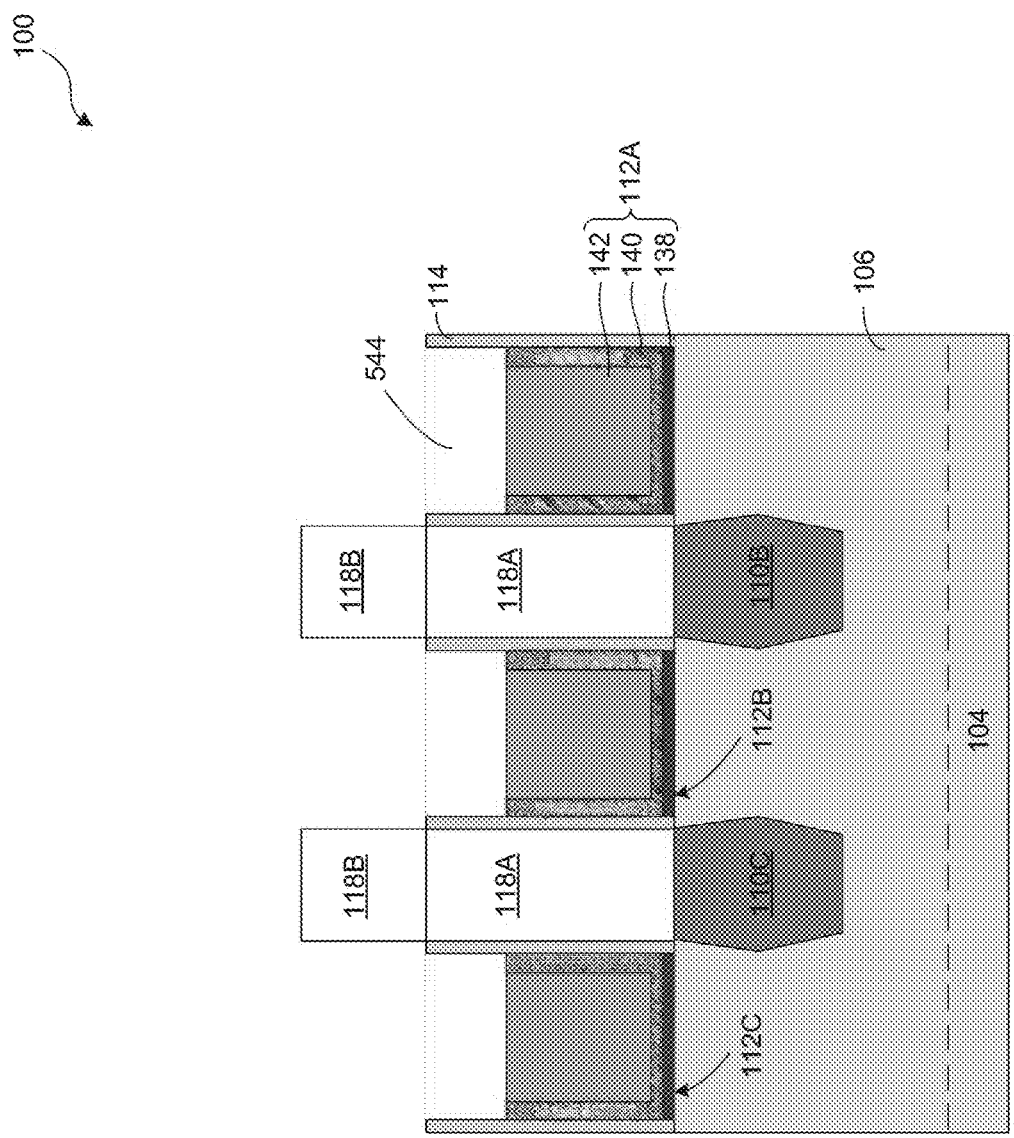
Figure 6:
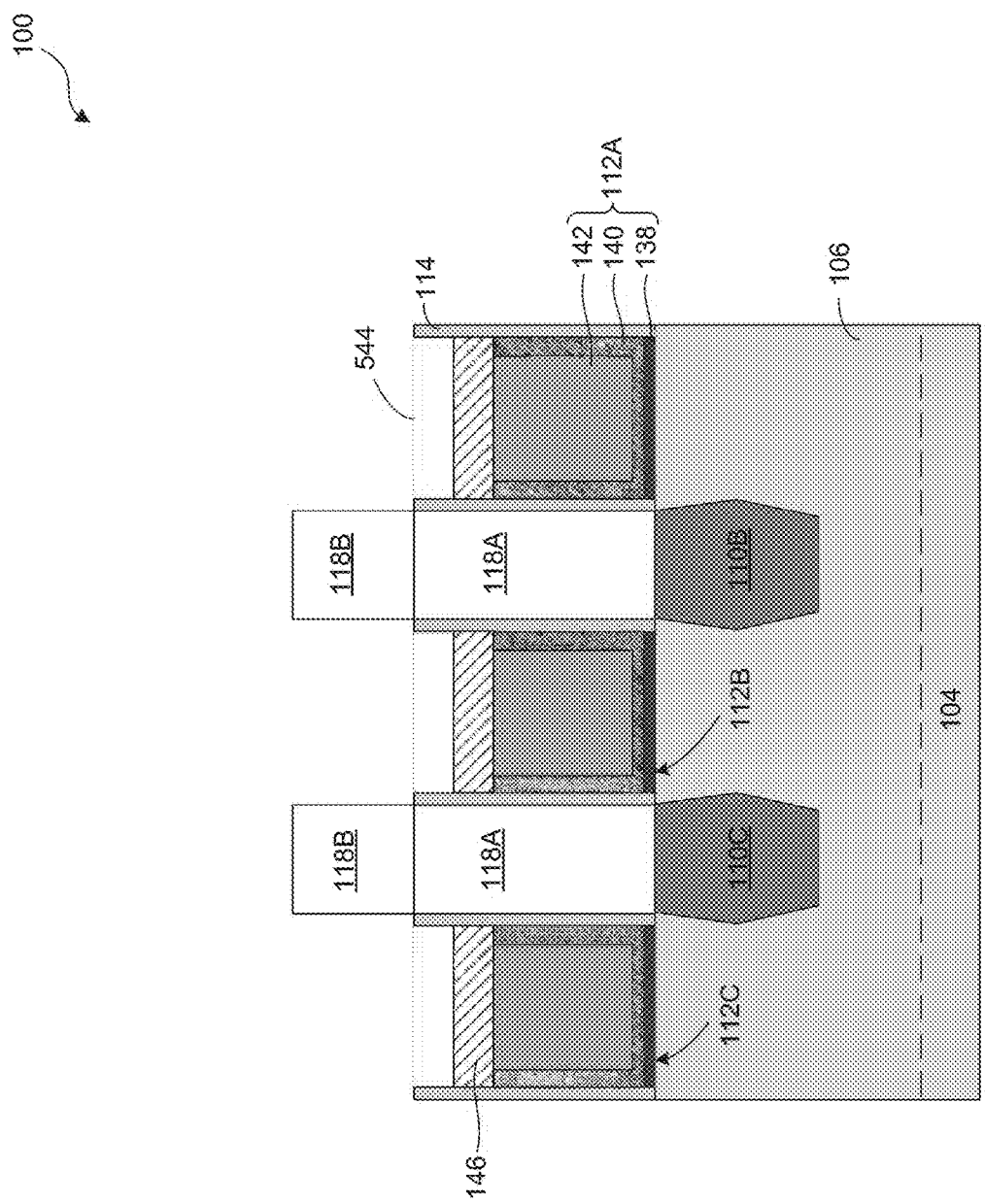
Figure 7:
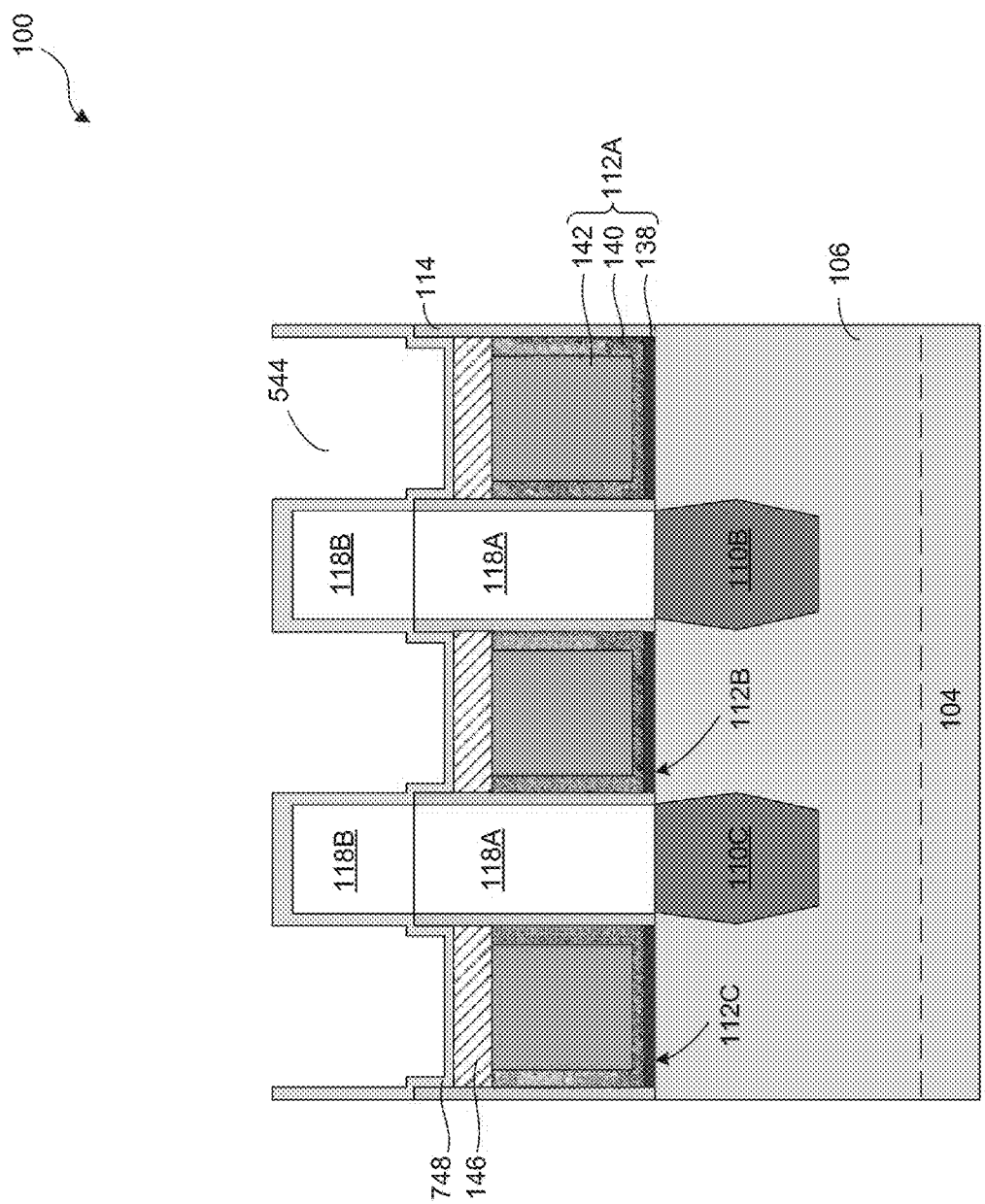
Figure 8:
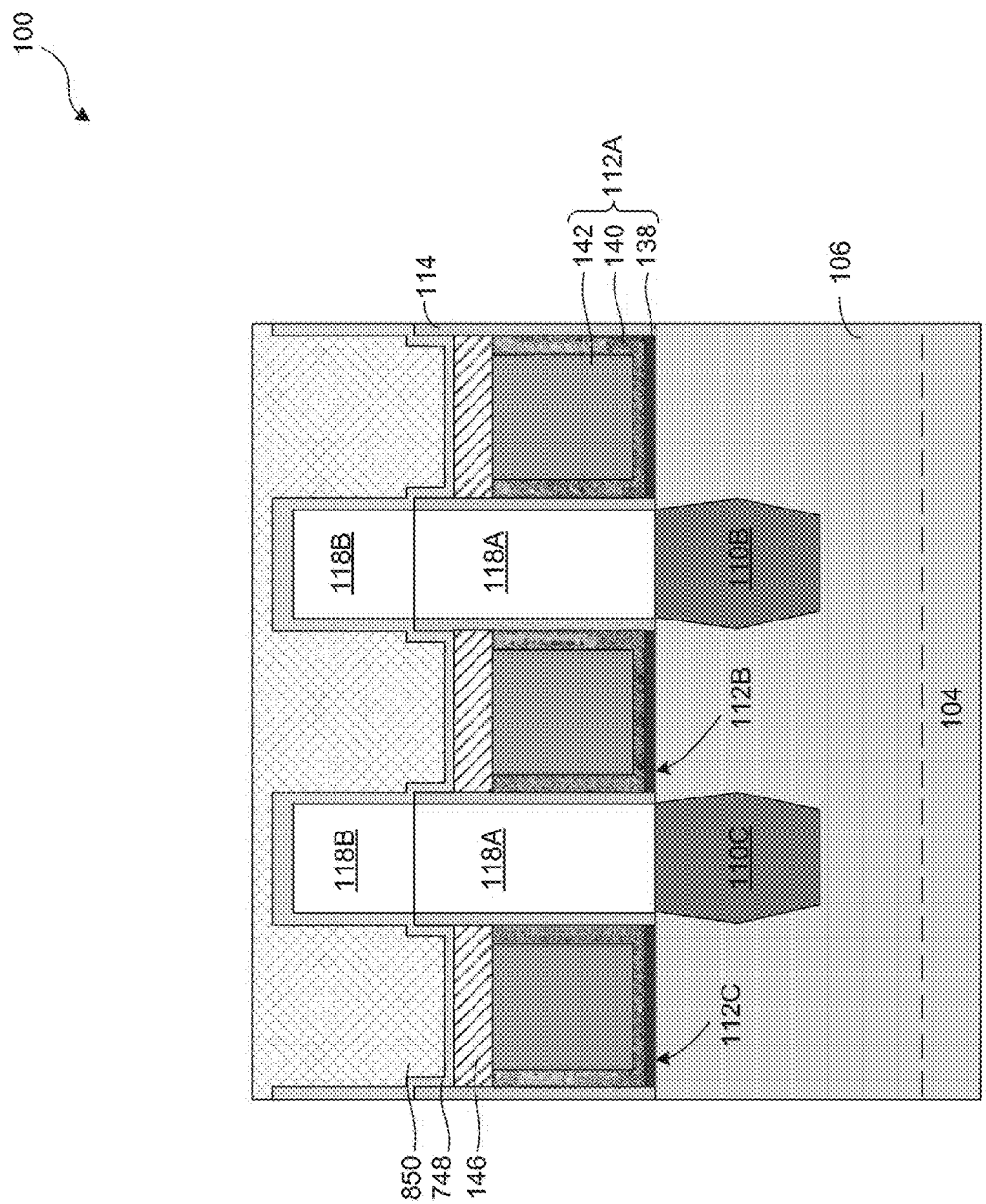
Figure 9:
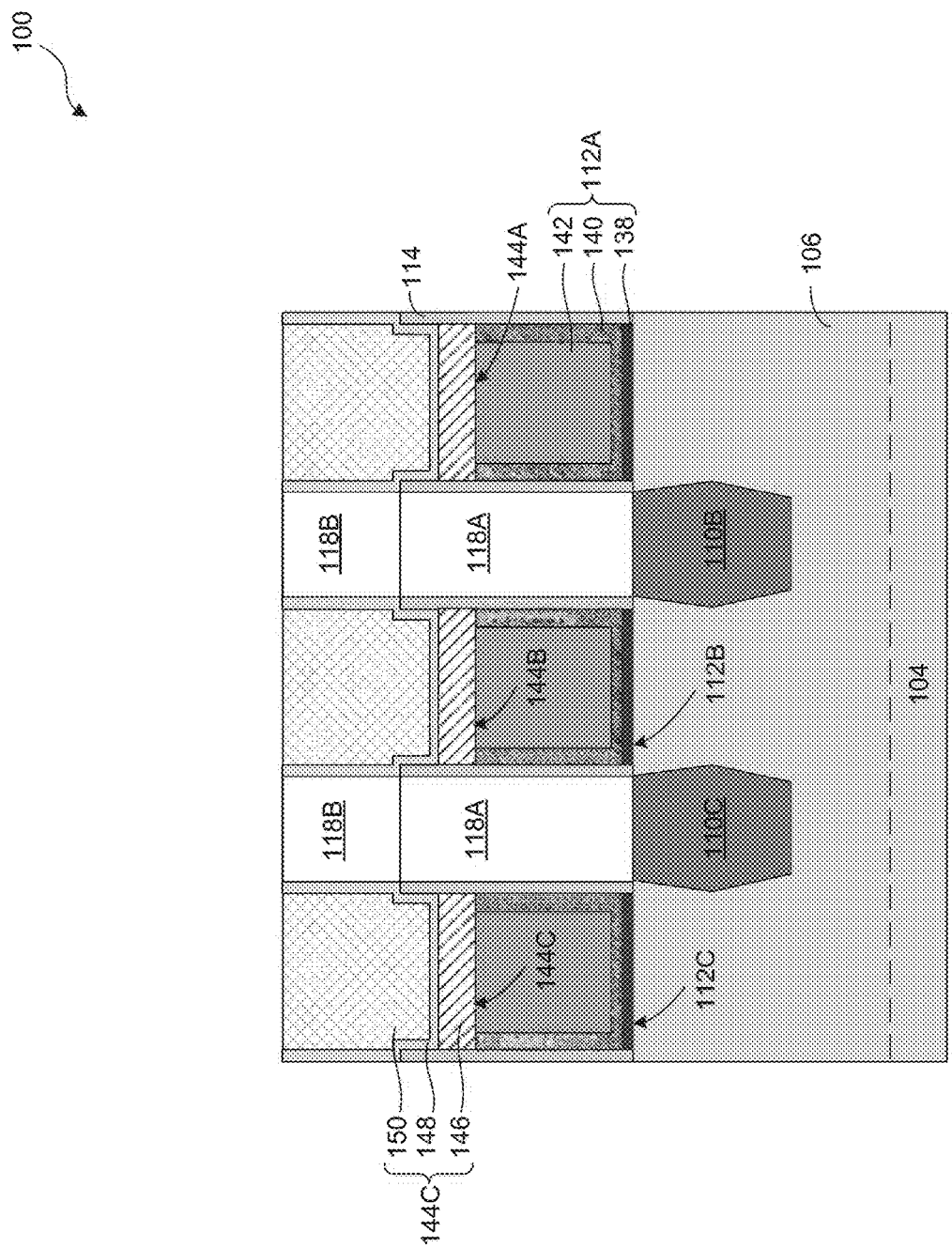

Referring to FIG. 2, in operation 215, gate capping structures are formed on the gate structures. For example, as described with reference to FIGS. 5-9, gate capping structures 144A-144C are formed on gate structures 112A-112C. The formation of gate capping structures 144A-144C can include sequential operations of (i) etching the portions of ILD layer 118B on gate structures 112A-112C and the layers of gate structures 112A-112C to form gate cap openings 544, as shown in FIG. 5, (ii) forming conductive gate caps 146 within gate cap openings 544, as shown in FIG. 6, (iii) depositing a metal nitride layer 748 on the structure of FIG. 6 to form the structure of FIG. 7, (iv) depositing a carbide layer 850 with a carbon atom concentration ranging from about 30 atomic % to about 50 atomic % on the structure of FIG. 7 to form the structure of FIG. 8, and (v) performing a chemical mechanical polishing (CMP) process on the structure of FIG. 8 to form the structure of FIG. 9.

In some embodiments, the formation of conductive gate caps 146 can include depositing fluorine-free W layers of about 2 nm to about 20 nm within gate cap openings 544 using a bottom-up deposition process or other suitable deposition processes with a $WCl_5$ precursor gas at a temperature ranging from about 300° C. to about 550° C. and at a pressure ranging from about 15 torr to about 40 torr. Other thicknesses, temperatures, and pressure ranges are within the scope of the disclosure. The use of fluorine-free W for conductive gate caps 146 prevent degradation of underlying gate structures 112A-112C from fluorine contamination. In some embodiments, the deposition of metal nitride layer 748 can include sequential operations of (i) depositing a metal layer (not shown) on the structure of FIG. 6 using a deposition process, and (ii) performing a nitridation process on the deposited metal layer using ammonia ($NH_3$) or nitrogen gas.

Figure 10:
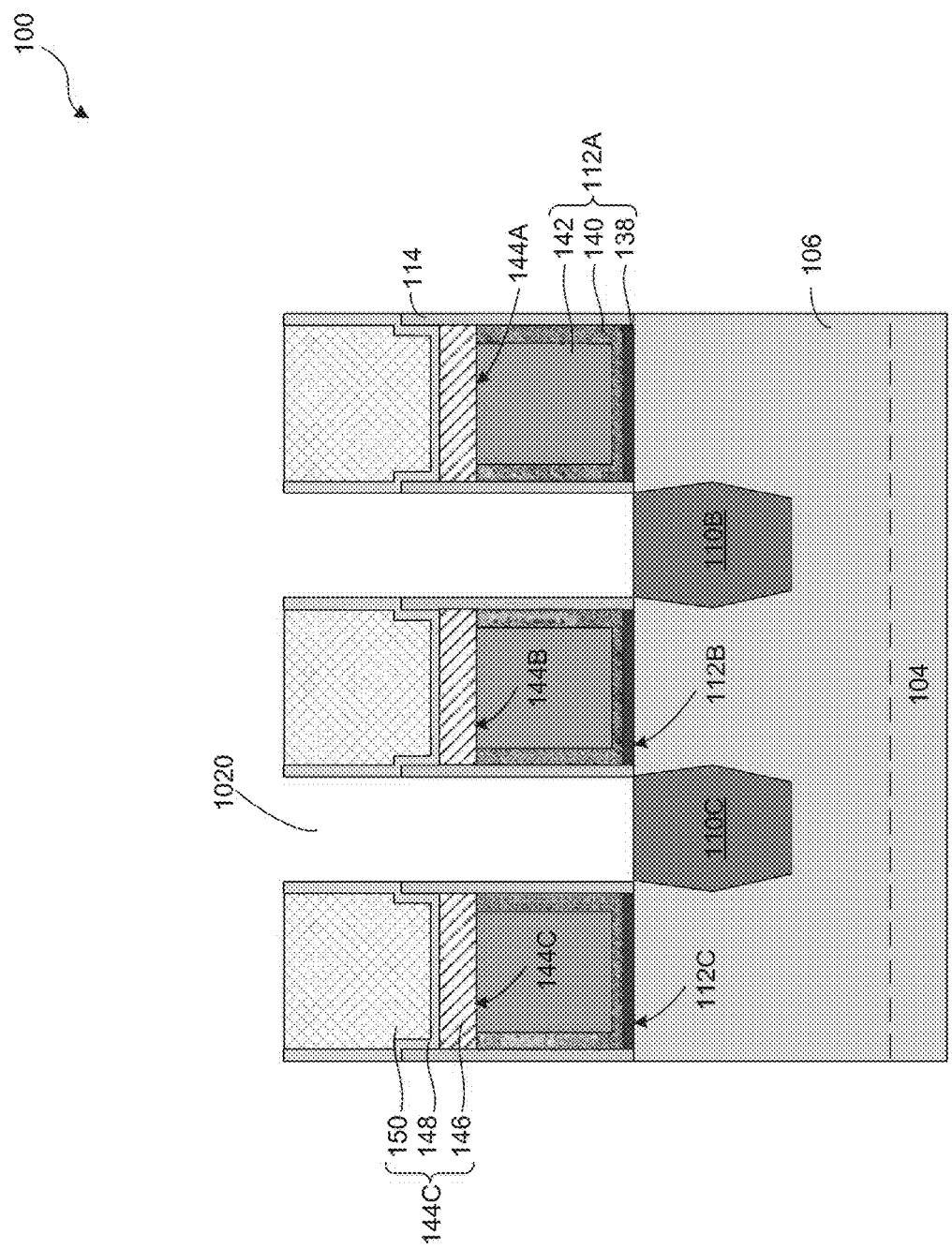
Figure 11:
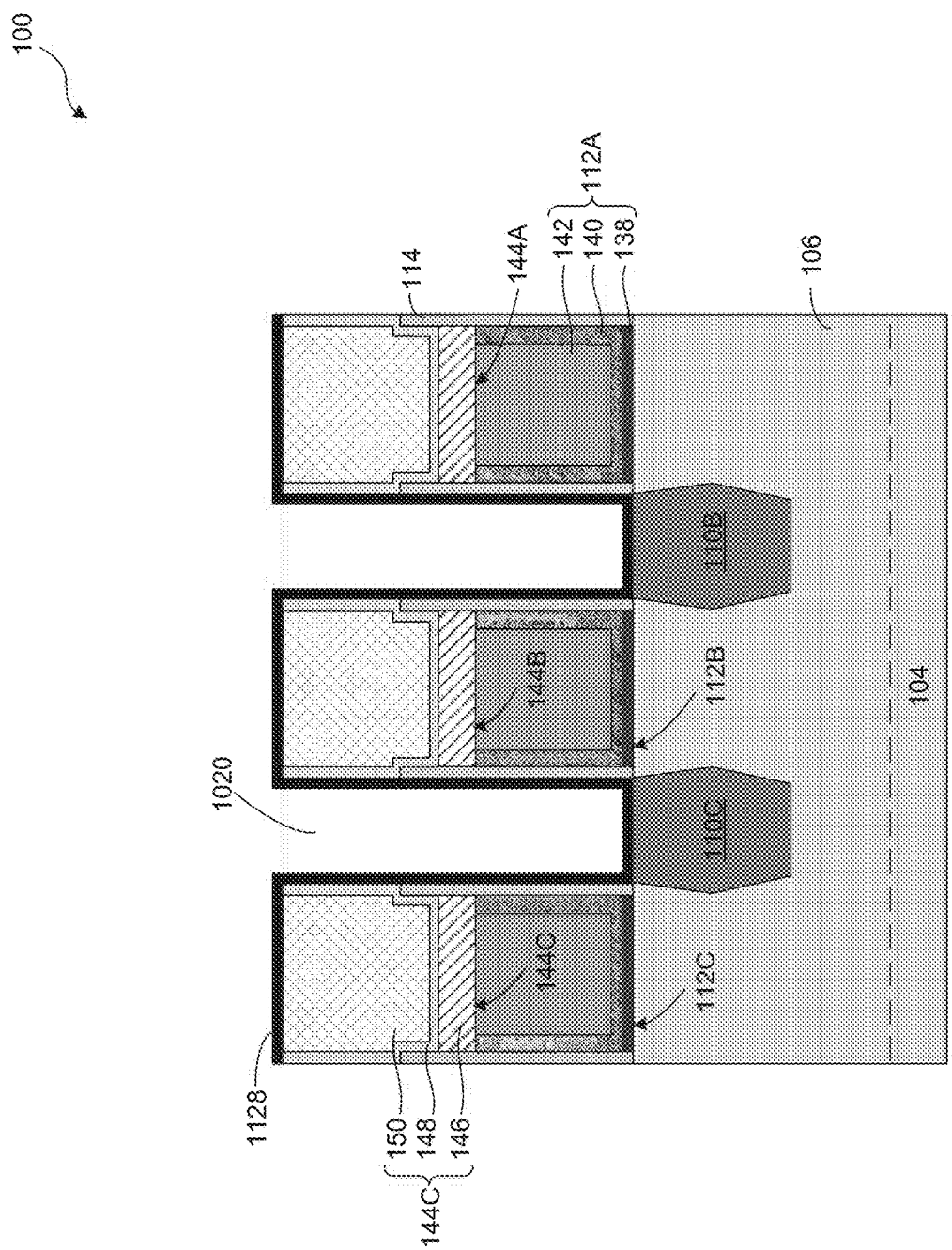
Figure 12:
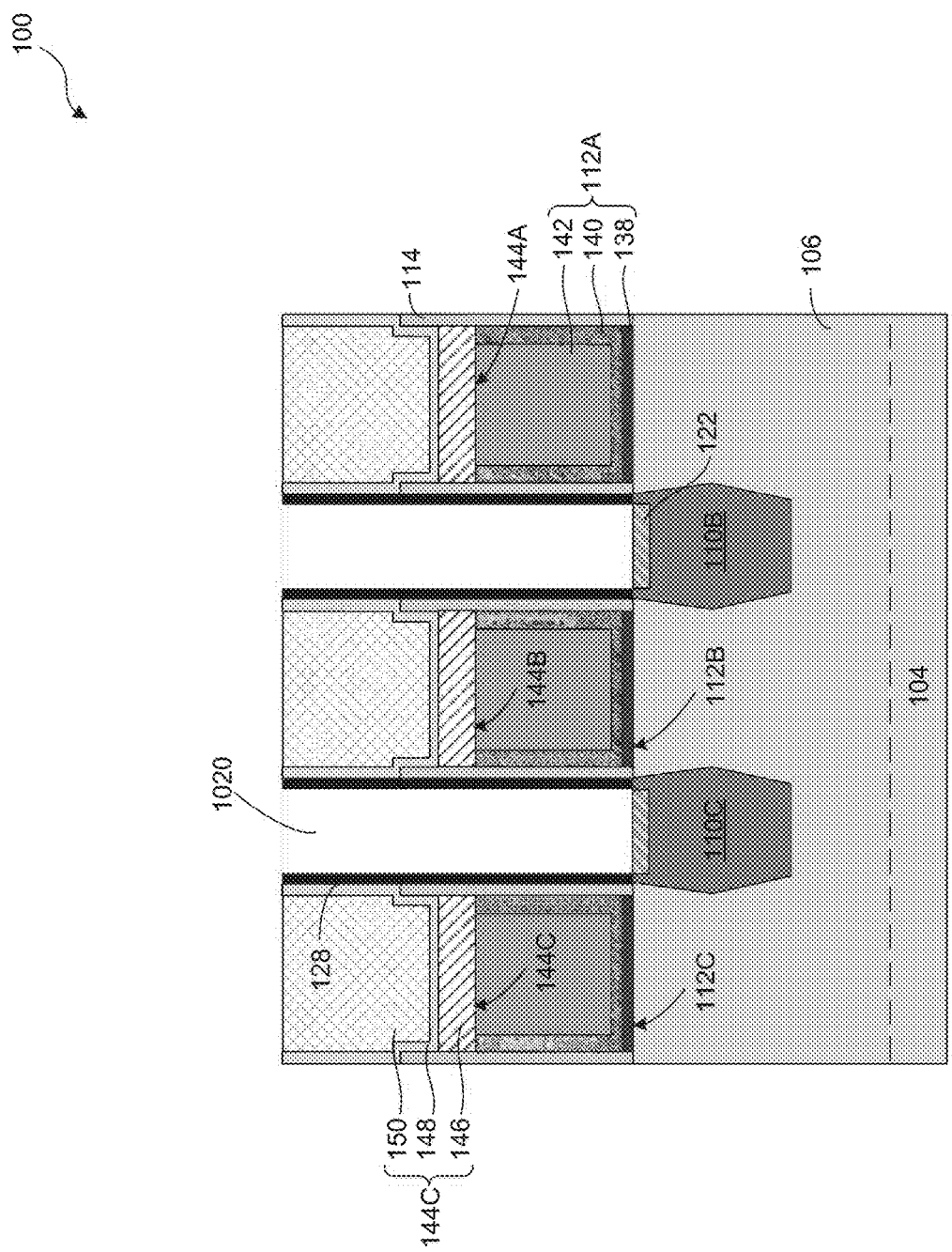
Figure 13:
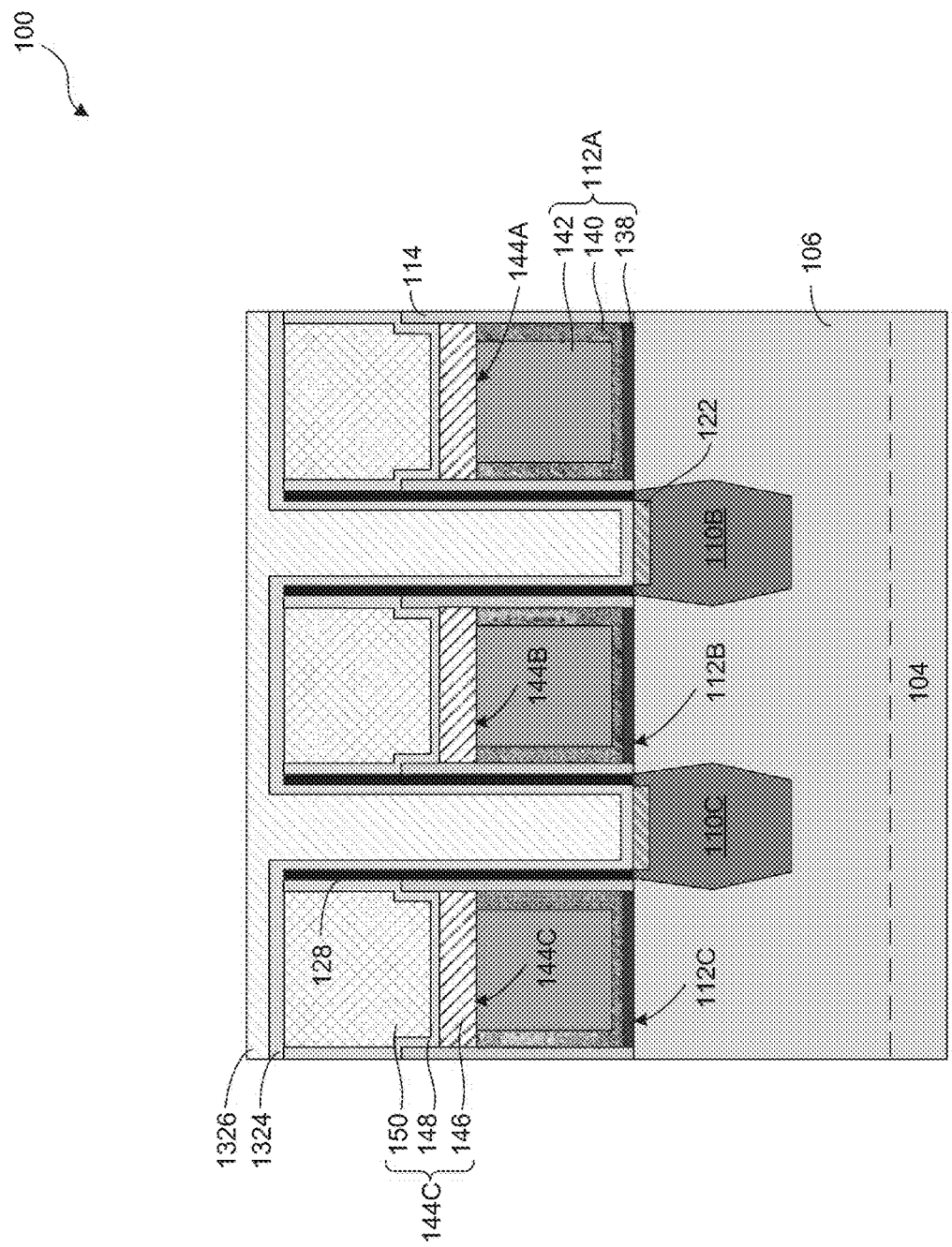
Figure 14:
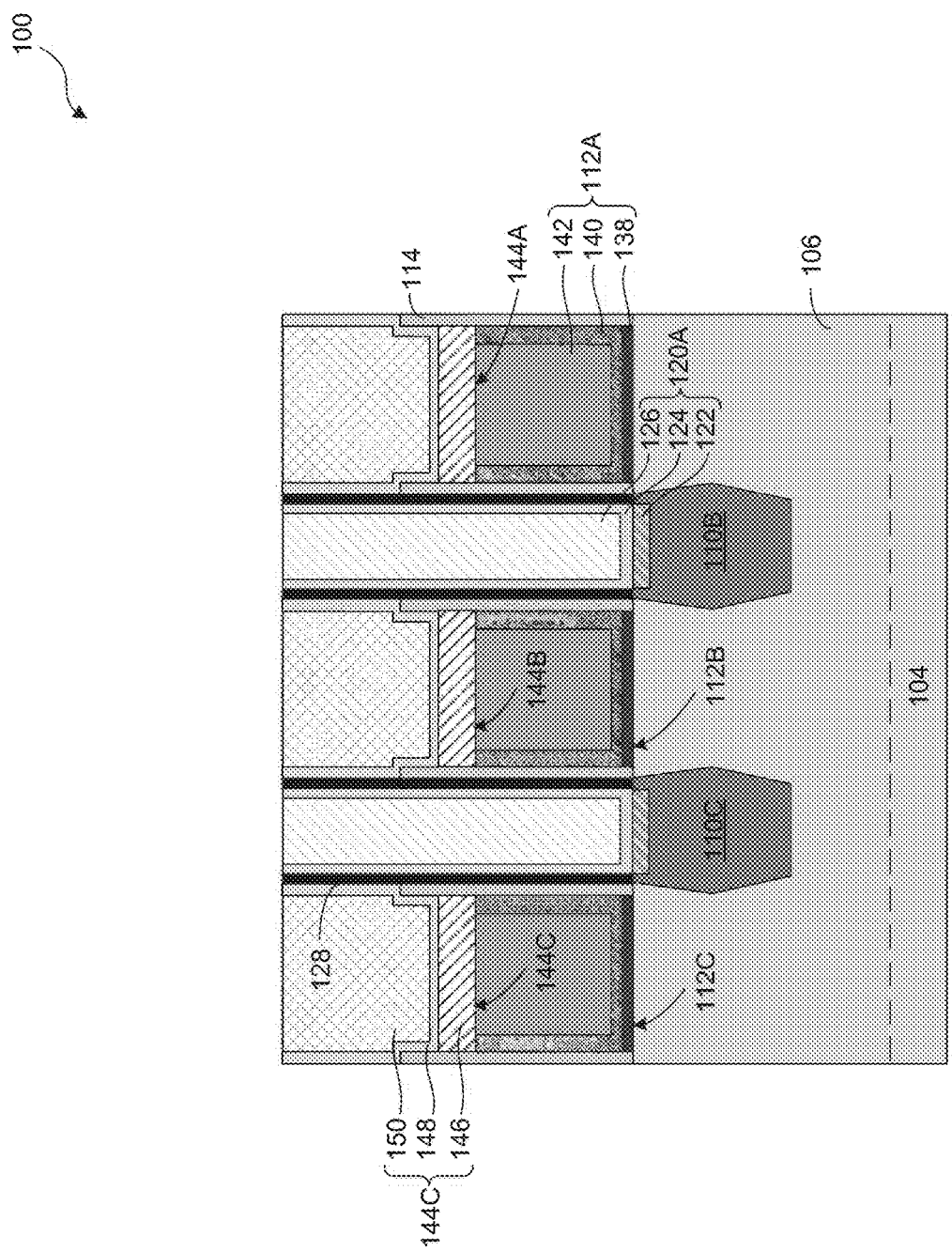
Figure 15:
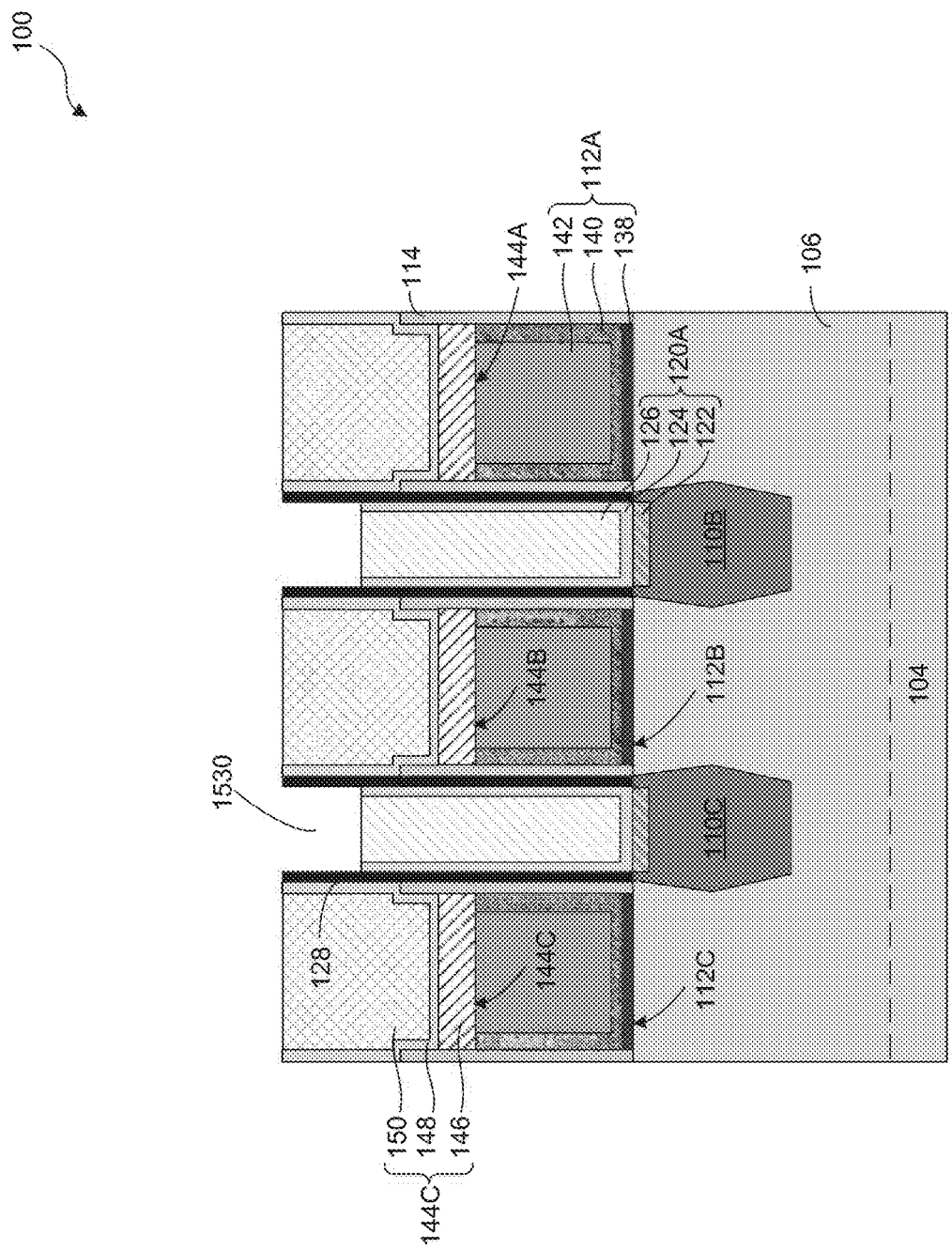
Figure 16:
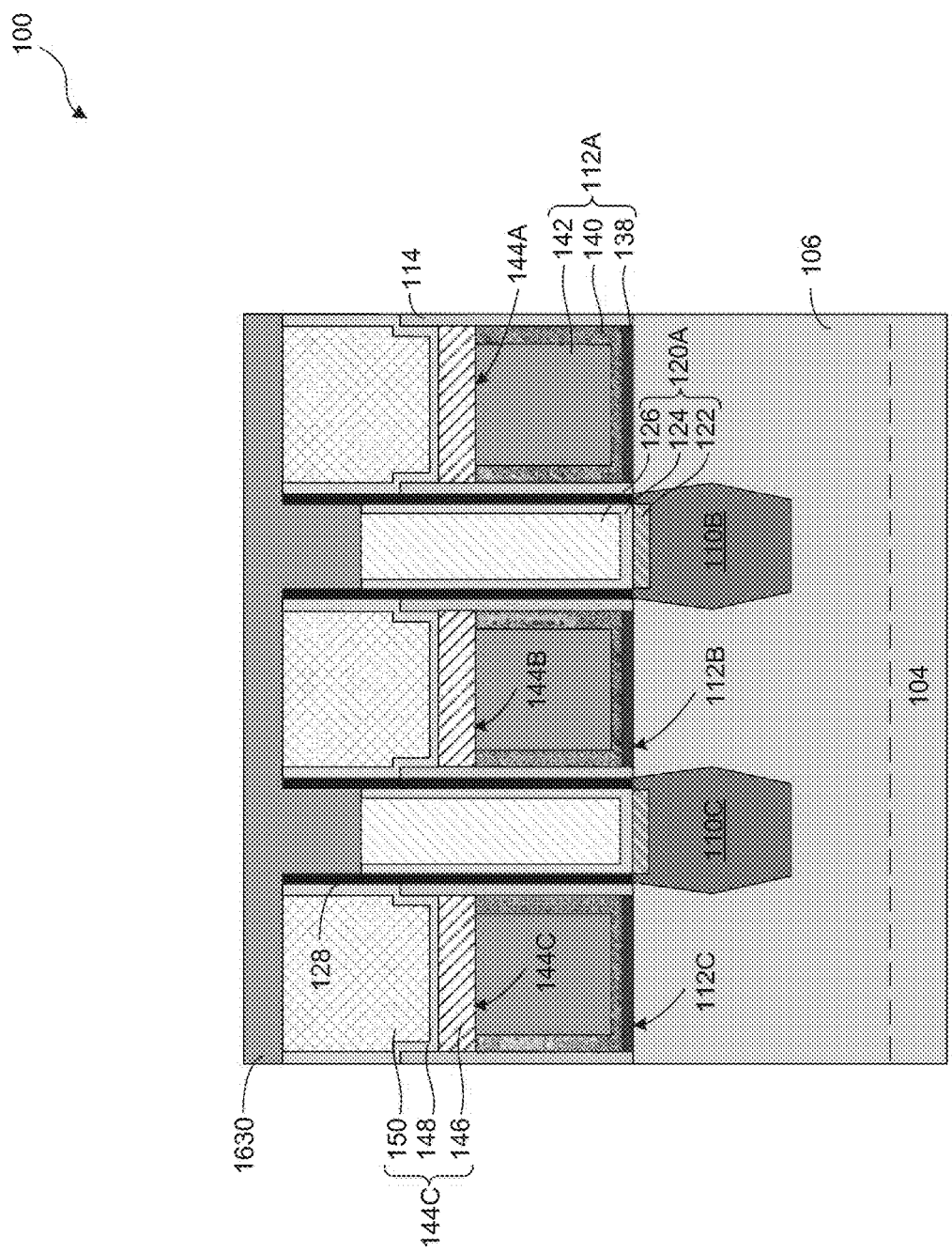
Figure 17:
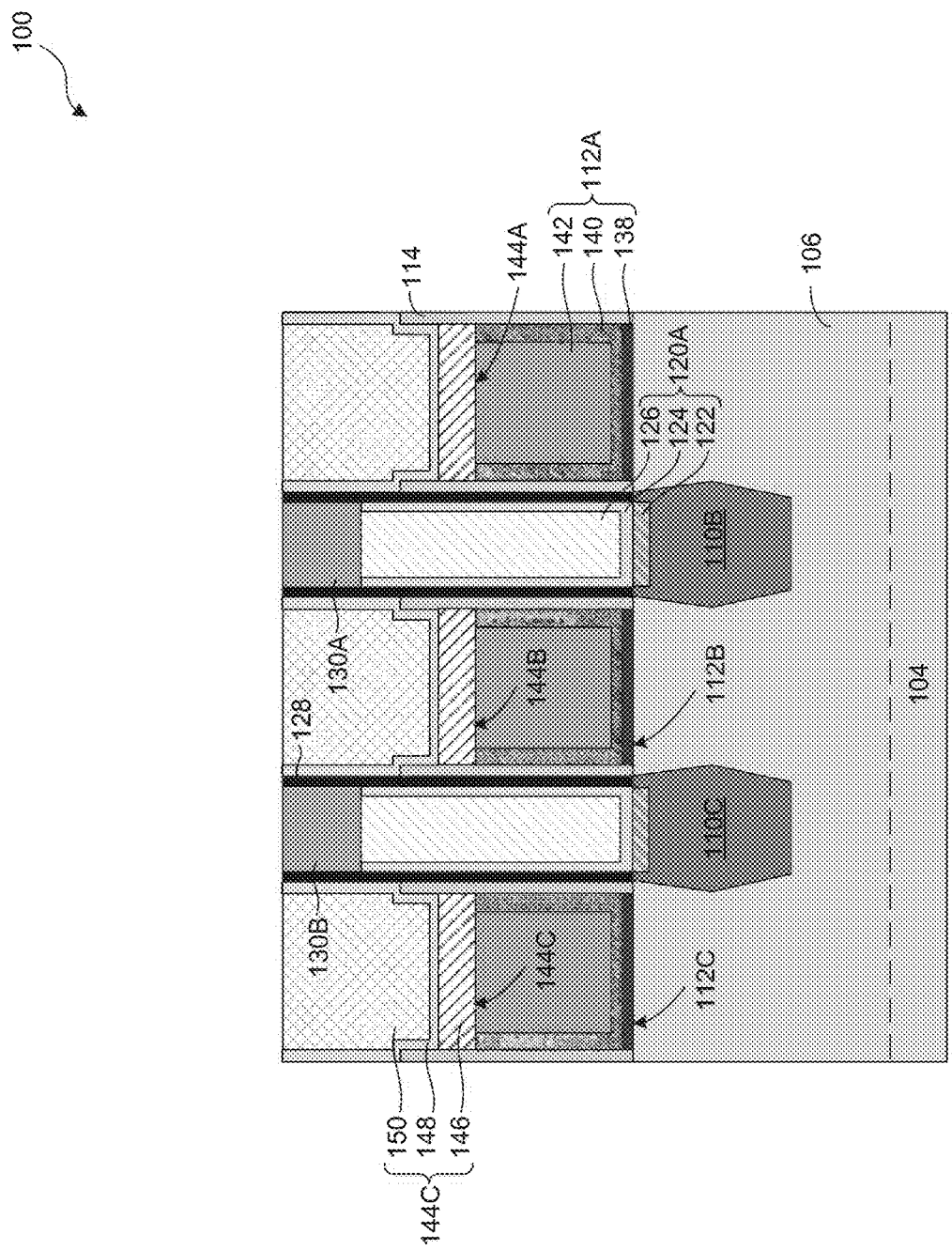

Referring to FIG. 2, in operation 220, S/D contact structures are formed on the S/D regions. For example, as described with reference to FIGS. 10-14, S/D contact structures 120A-120B are formed on S/D regions 110B-110C. The formation of S/D contact structures 120A-120B can include sequential operations of (i) forming S/D contact openings 1020 on S/D regions 110B-110C through ILD layers 118A-118B, as shown in FIG. 10, (ii) depositing a dielectric nitride layer 1128 on the structure of FIG. 10 to form the structure of FIG. 11, (iii) selectively etching portions of dielectric nitride layer 1128 from the top surfaces of gate capping structures 144A-144C and S/D regions 110B-110C to form diffusion barrier layer 128, as shown in FIG. 12, (iv) forming silicide layers 122 within S/D regions 110B-110C, as shown in FIG. 12, (v) depositing a metal layer (not shown) on the structure of FIG. 12, (vi) performing a nitridation process on the deposited metal layer using ammonia ($NH_3$) or nitrogen gas to form metal nitride layer 1324, as shown in FIG. 15, (vii) depositing a conductive layer 1526 on metal nitride layer 1324 to form the structure of FIG. 13, and (viii) performing a CMP process on the structure of FIG. 13 to form the structure of FIG. 14. In some embodiments, metal nitride layer 1324 can be deposited with a thickness of about 1 nm to about 2 nm using an ALD process at a temperature of about 400° C. to about 450° C. Other thicknesses and temperature ranges are within the scope of the disclosure.

Referring to FIG. 2, in operation 225, S/D capping structures are formed on the S/D contact structures. For example, as described with reference to FIGS. 15-17, S/D capping structures 130A-130B are formed on S/D contact structures 120A-120B. The formation of S/D capping structures 130A-130B can include sequential operations of (i) etching portions of S/D contact structures 120A-120B to form S/D cap openings 1530, as shown in FIG. 15, (ii) depositing a nitride, oxide, or oxynitride layer 1630 on the structure of FIG. 15 to form the structure of FIG. 16, and (ii) performing a CMP process on the structure of FIG. 16 to form the structure of FIG. 17. After the formation of S/D capping structures 130A-130B, ESL 117B and ILD layer 118C can be formed on the structure of FIG. 17.

Figure 18:
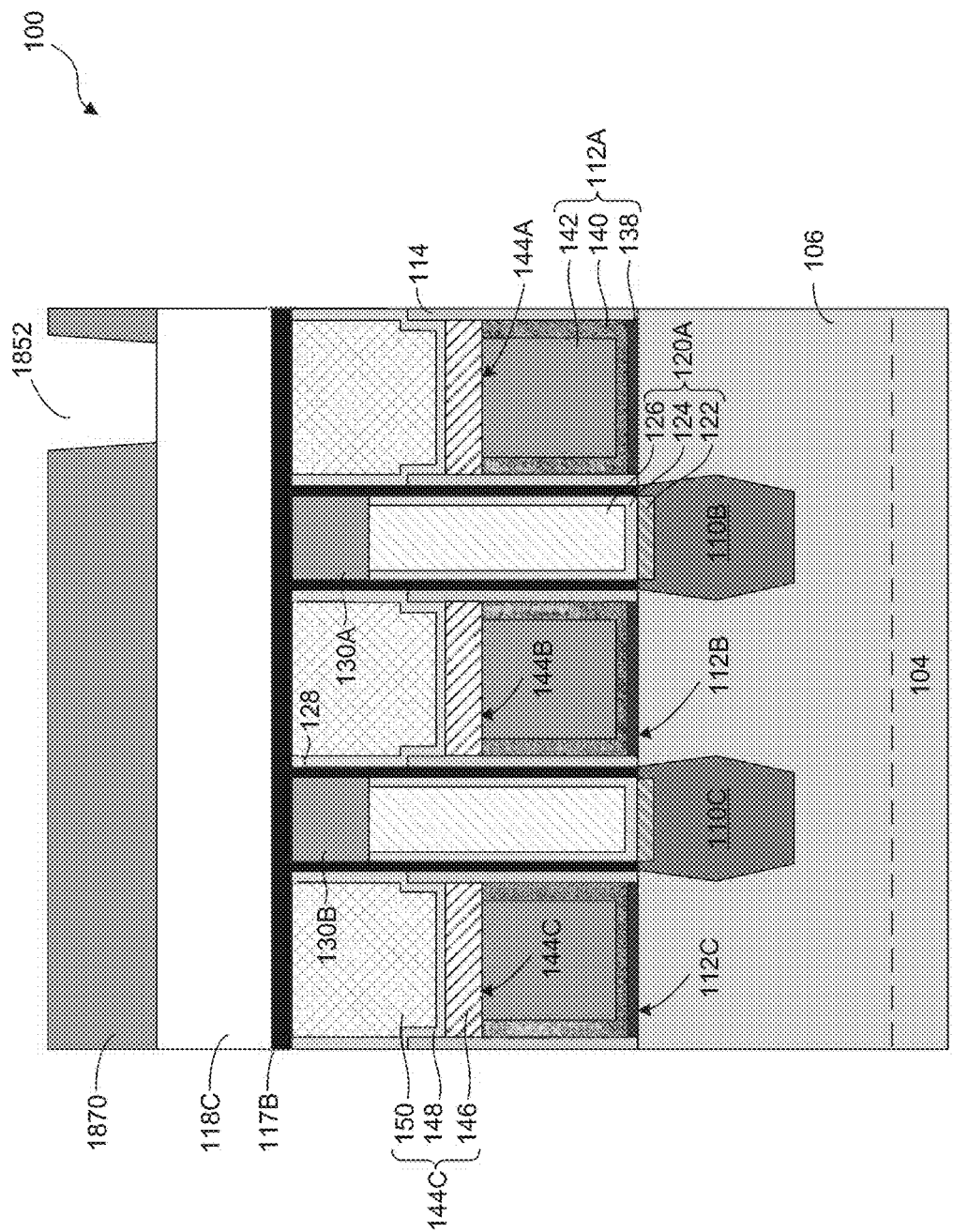
Figure 19:
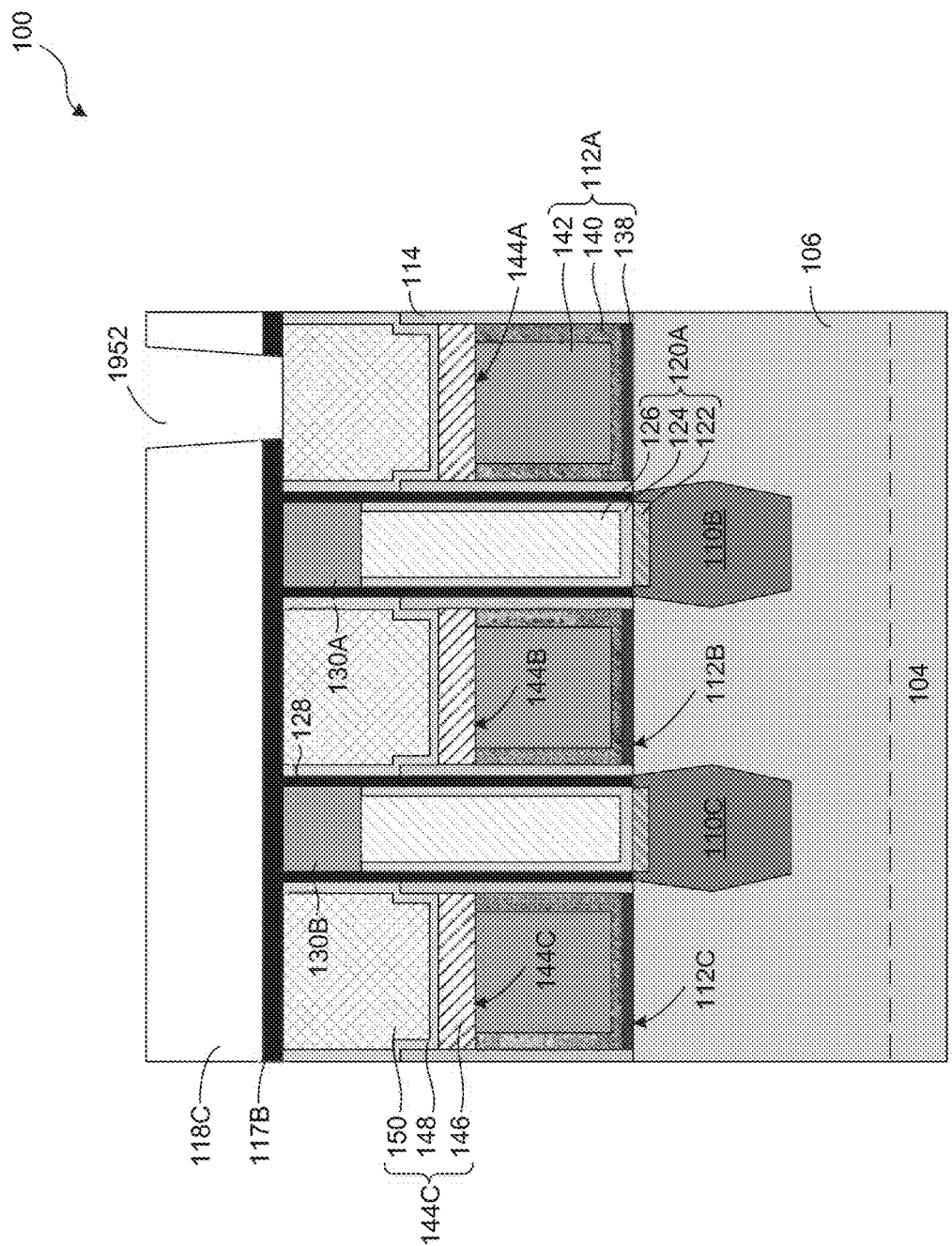

Referring to FIG. 2, in operation 230, a gate contact opening is formed on one of the gate capping structures. For example, as described with reference to FIGS. 18-20, a gate contact opening 2052 is formed on conductive gate cap 146 of gate capping structure 144A. The formation of gate contact opening 2052 can include sequential operations of (i) depositing a masking layer 1870 on the structure of FIG. 17, (ii) performing a first etching process to form opening 1852 within masking layer 1870 and aligned with gate capping structure 144A, as shown in FIG. 18, (iii) performing a second etching process to remove portions of ILD layer 118C and ESL 117B underlying opening 1852 to extend opening 1852 into ESL 117B and form opening 1952, as shown in FIG. 19, and (iv) performing a third etching process to remove portions of carbon-based gate cap 150, gate cap liner 148, and conductive gate cap 146 underlying opening 1952 to extend opening 1952 into gate capping structure 144A and form gate cap opening 2052, as shown in FIG. 20.

In some embodiments, the second etching process can include sequential operations of (i) etching the portions of ILD layer 118C with an etching gas mixture of fluoromethane ($CH_3F$) and oxygen, and (ii) etching the portions of ESL 117B with an etching gas mixture of Hexafluorocyclobutene ($C_4F_6$) and oxygen. In some embodiments, the third etching process can include sequential operations of (i) etching the portions of carbon-based gate cap 150 with an etching gas mixture of nitrogen trifluoride ($NF_3$) and oxygen, (ii) etching the portions of gate cap liner 148 with an etching gas mixture of $CH_3F$ and oxygen, and (iii) etching the portions of conductive gate cap 146 with an etching gas mixture of $NF_3$ and oxygen and/or sulfur hexafluoride ($SF_6$) and oxygen. In some embodiments, the concentration ratio of $NF_3$ to oxygen in the etching gas mixture for carbon-based gate cap 150 can range from about 20:70 to about 25:75 to achieve a high carbide to nitride or oxide etch selectivity ranging from about 50 to about 60. Such high etch selectivity can prevent or minimize etching of adjacent nitride or oxide based S/D capping structure 130A and facilitate the formation of gate cap opening 2052 on gate structure 112A with minimal or no misalignment. In some embodiments, the first, second, and third etching processes can be performed with etching gas flow rates ranging from about 5 sccm to about 1000 sccm, at a pressure ranging from about 0.05 torr to about 100 torr, at an RF power ranging from about 30 W to about 1000 W, at a voltage bias ranging from about 50 V to about 300 V, and at a temperature ranging from about 50° C. to about 100° C.

Figure 21:
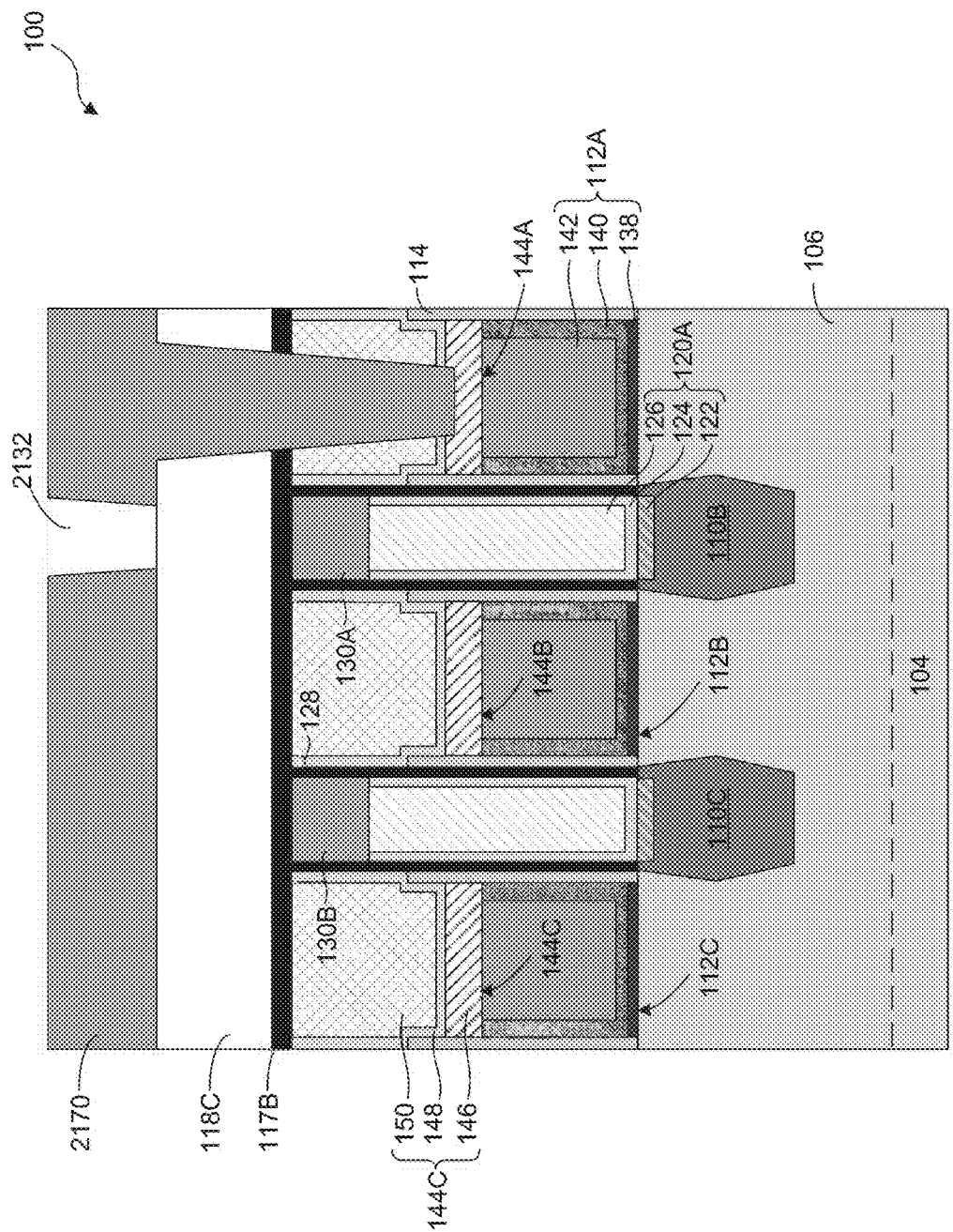

Referring to FIG. 2, in operation 235, a via opening is formed on one of the S/D contact structures. For example, as described with reference to FIGS. 21-22, a via opening 2232 is formed on S/D contact structure 120A. The formation of via opening 2232 can include sequential operations of (i) depositing a masking layer 2170 on the structure of FIG. 20, (ii) performing a first etching process to form opening 2132 within masking layer 2170 and aligned with S/D capping structure 130A and S/D contact structure 120A, as shown in FIG. 21, and (iii) performing a second etching process to remove portions of ILD layer 118C, ESL 117B, and S/D capping structure 130A underlying opening 2132 to extend opening 2132 into S/D contact structure 120A and form via opening 2232, as shown in FIG. 22. The discussion of the second etching process in operation 230 applies to the second etching process in operation 235, unless mentioned otherwise. In some embodiments, removing the portions of S/D capping structure 130A during the second etching process can include using the etching gas mixture of $CH_3F$ and oxygen.

Figure 23:
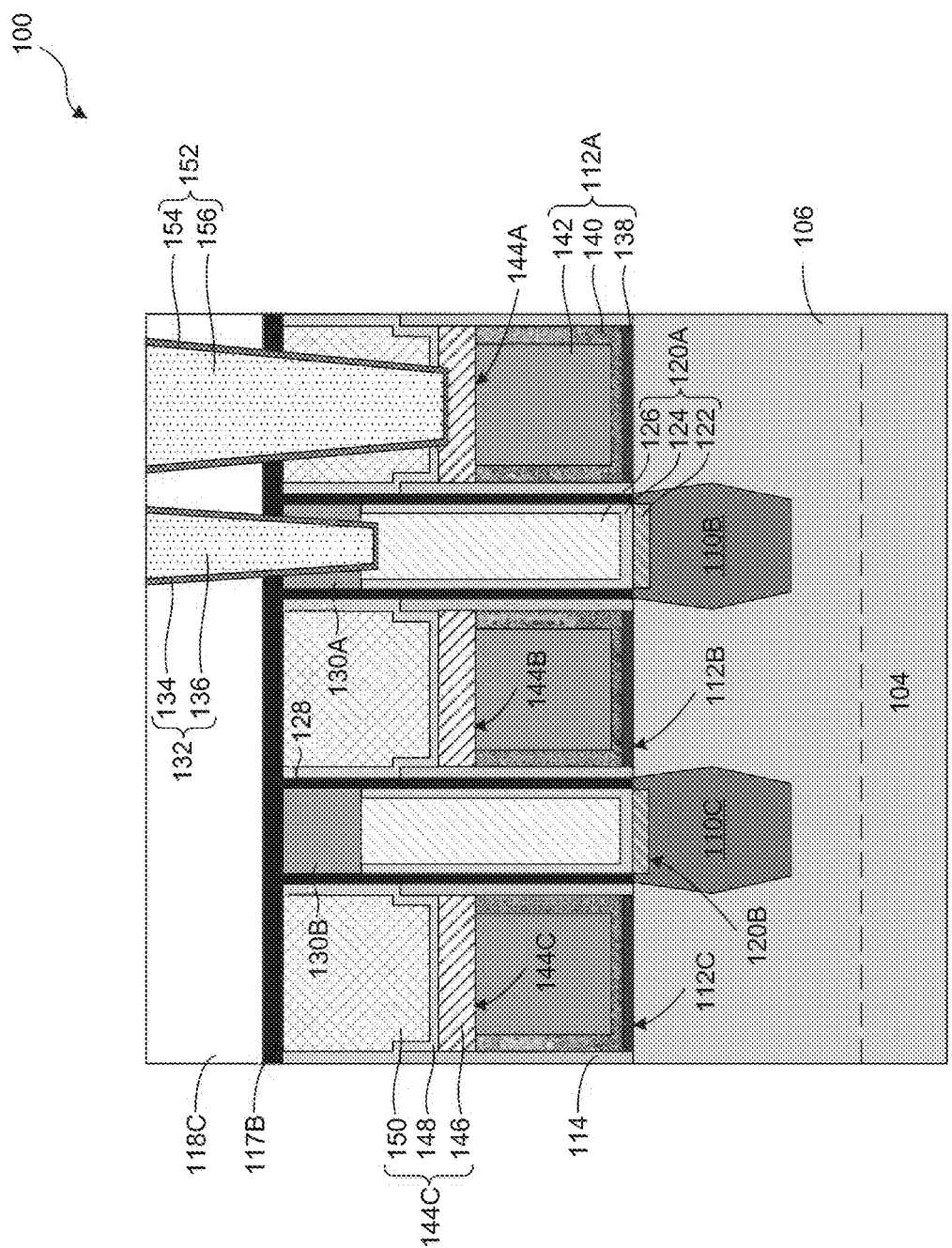
Figure 24:
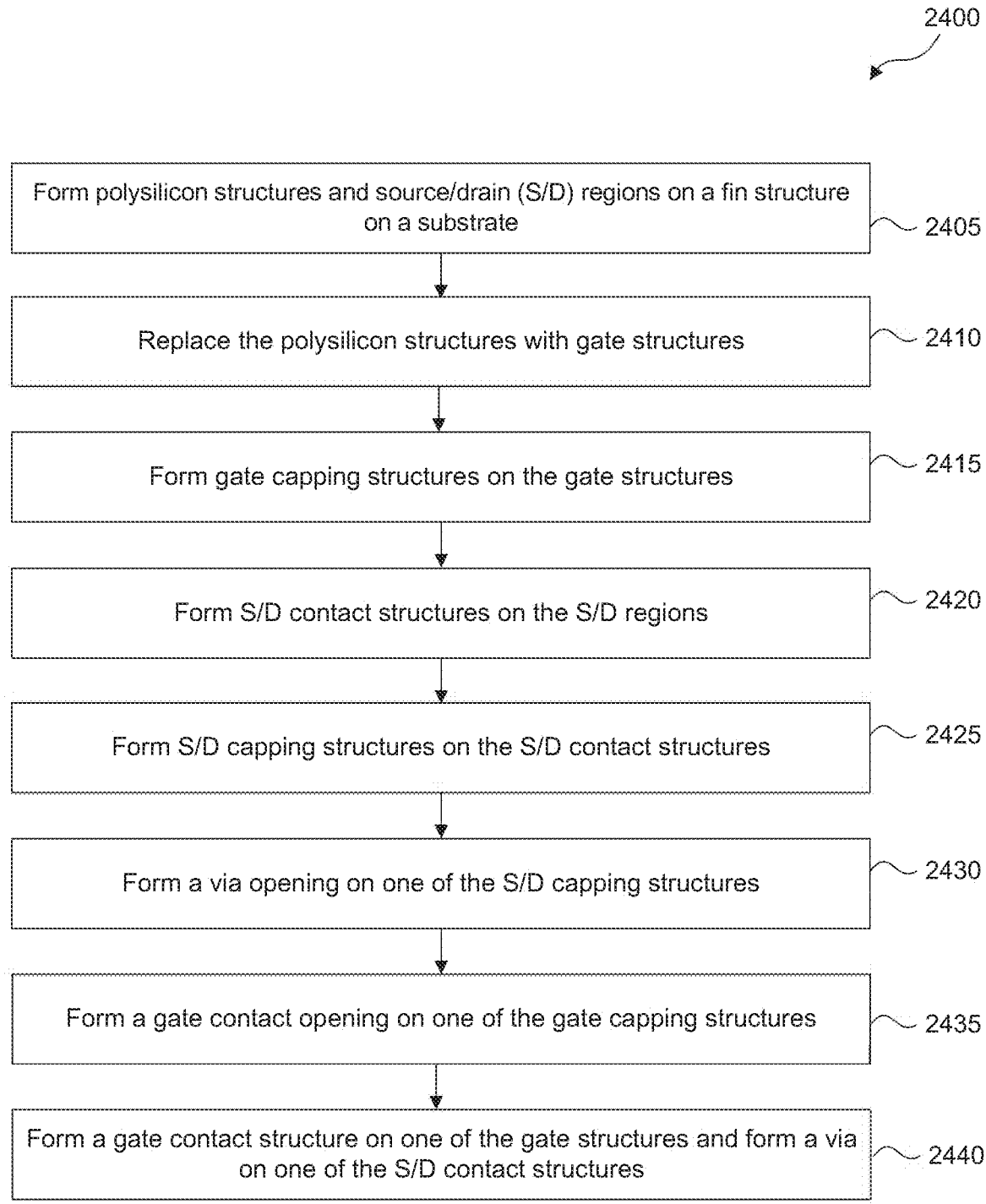
FIG. 24 is a flow diagram of a method for fabricating a semiconductor device with S/D and gate capping structures, in accordance with some embodiments.

Referring to FIG. 2, in operation 240, a gate contact structure is formed on one of the gate structures and a via is formed on one of the S/D contact structures. For example, as shown in FIG. 24, gate contact structure 152 is formed on gate structure 112A and via 132 is formed on S/D contact structure 120A. The formation of gate contact structures 152 can include sequential operations of (i) depositing the material of liner 154 on the structure of FIG. 22, (ii) depositing the material of contact plug 156 on the deposited material of liner 154, and (iii) performing a CMP process on the deposited materials of liner 154 and contact plug 156 to form gate contact structure 152, as shown in FIG. 23. The formation of via 132 can include sequential operations of (i) depositing the material of liner 134 on the structure of FIG. 22, (ii) depositing the material of contact plug 136 on the deposited material of liner 134, and (iii) performing a CMP process on the deposited materials of liner 134 and contact plug 136 to form via 132, as shown in FIG. 23. In some embodiments, liners 134 and 154 and contact plugs 136 and 156 can be formed at the same time if liners 134 and 154 have the same material and contact plugs 136 and 156 have the same material. In some embodiments, if liners 134 and 154 have different materials and/or contact plugs 136 and 156 have different materials, via 132 can be formed prior to or after the formation of gate contact structure 152.

FIG. 24 is a flow diagram of an example method 2400 for fabricating FET 100 with cross-sectional view shown in FIG. 1C, according to some embodiments. For illustrative purposes, the operations illustrated in FIG. 24 will be described with reference to the example fabrication process for fabricating FET 100 as illustrated in FIGS. 3-23 and FIGS. 25-35. FIGS. 3-23 and FIGS. 25-35 are cross-sectional views of FET 100 along line A-A of FIG. 1A at various stages of fabrication, according to some embodiments. Operations can be performed in a different order or not performed depending on specific applications. It should be noted that method 2400 may not produce a complete FET 100. Accordingly, it is understood that additional processes can be provided before, during, and after method 2400, and that some other processes may only be briefly described herein. Elements in FIGS. 3-23 and FIGS. 25-35 with the same annotations as elements in FIGS. 1A-1C are described above.

Referring to FIG. 24, operations 2405-2410 are similar to operations 205-210 of FIG. 2.

Figure 25:
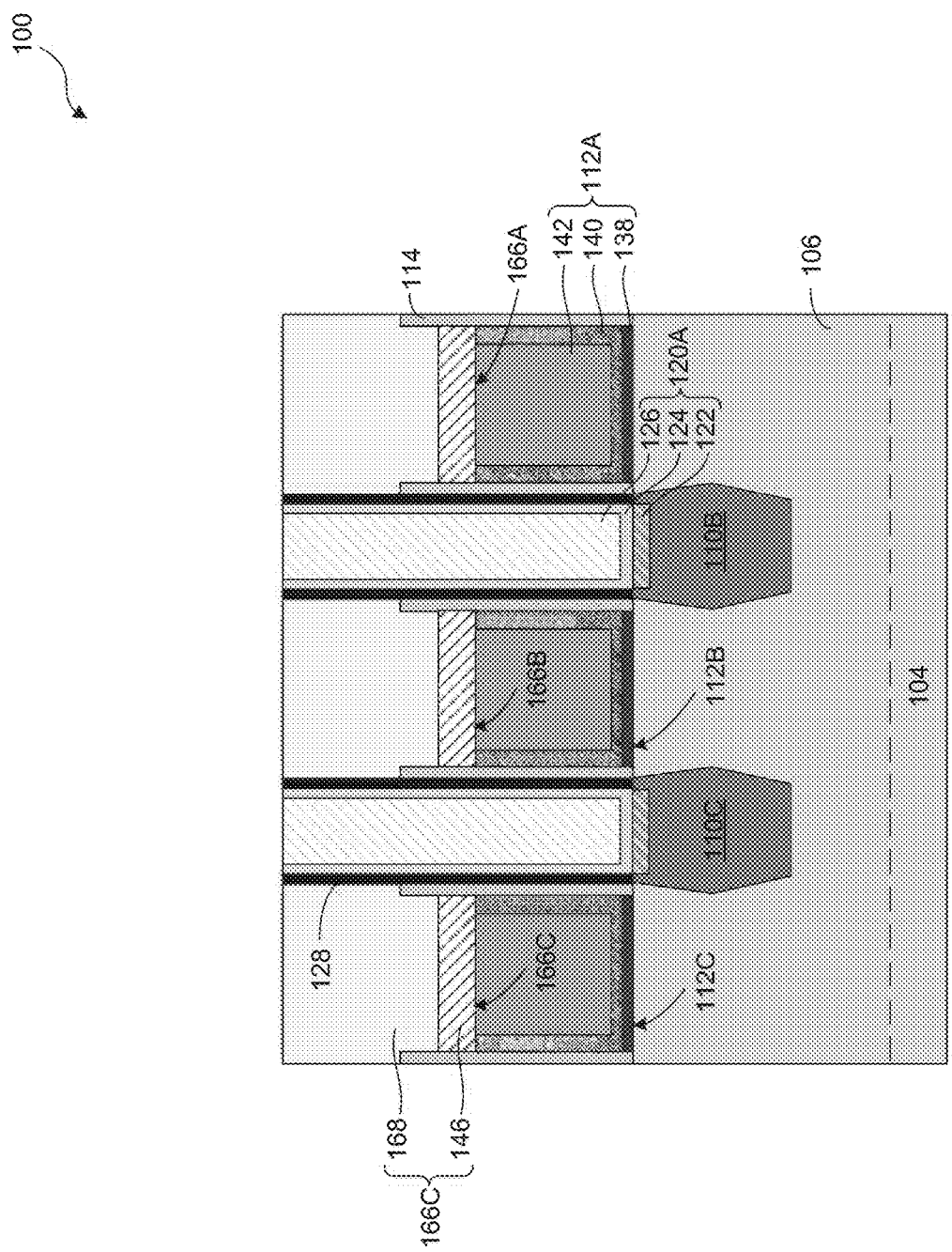
FIGS. 25-35 illustrate cross-sectional views of a semiconductor device with S/D and gate capping structures at various stages of its fabrication process, in accordance with some embodiments.

Referring to FIG. 24, in operation 2415, gate capping structures are formed on the gate structures. For example, as described with reference to FIGS. 5-6 and 25, gate capping structures 166A-166C are formed on gate structures 112A-112C. The discussion of the formation of gate capping structures 144A-144C applies to the formation of gate capping structures 166A-166C, unless mentioned otherwise. The formation of gate capping structures 166A-166C can include sequential operations of (i) etching the portions of ILD layer 118B on gate structures 112A-112C and the layers of gate structures 112A-112C to form gate cap openings 544, as shown in FIG. 5, (ii) forming conductive gate caps 146 within gate cap openings 544, as shown in FIG. 6, (iii) depositing a nitride, oxide, or oxynitride layer (not shown) on the structure of FIG. 6, and (iv) performing a CMP process on the nitride, oxide, or oxynitride layer to form gate capping structures 166A-166C, as shown in FIG. 25.

Referring to FIG. 24, operation 2420 is similar to operation 220 of FIG. 2. After operation 2420, the structure of FIG. 25 is formed.

Figure 26:
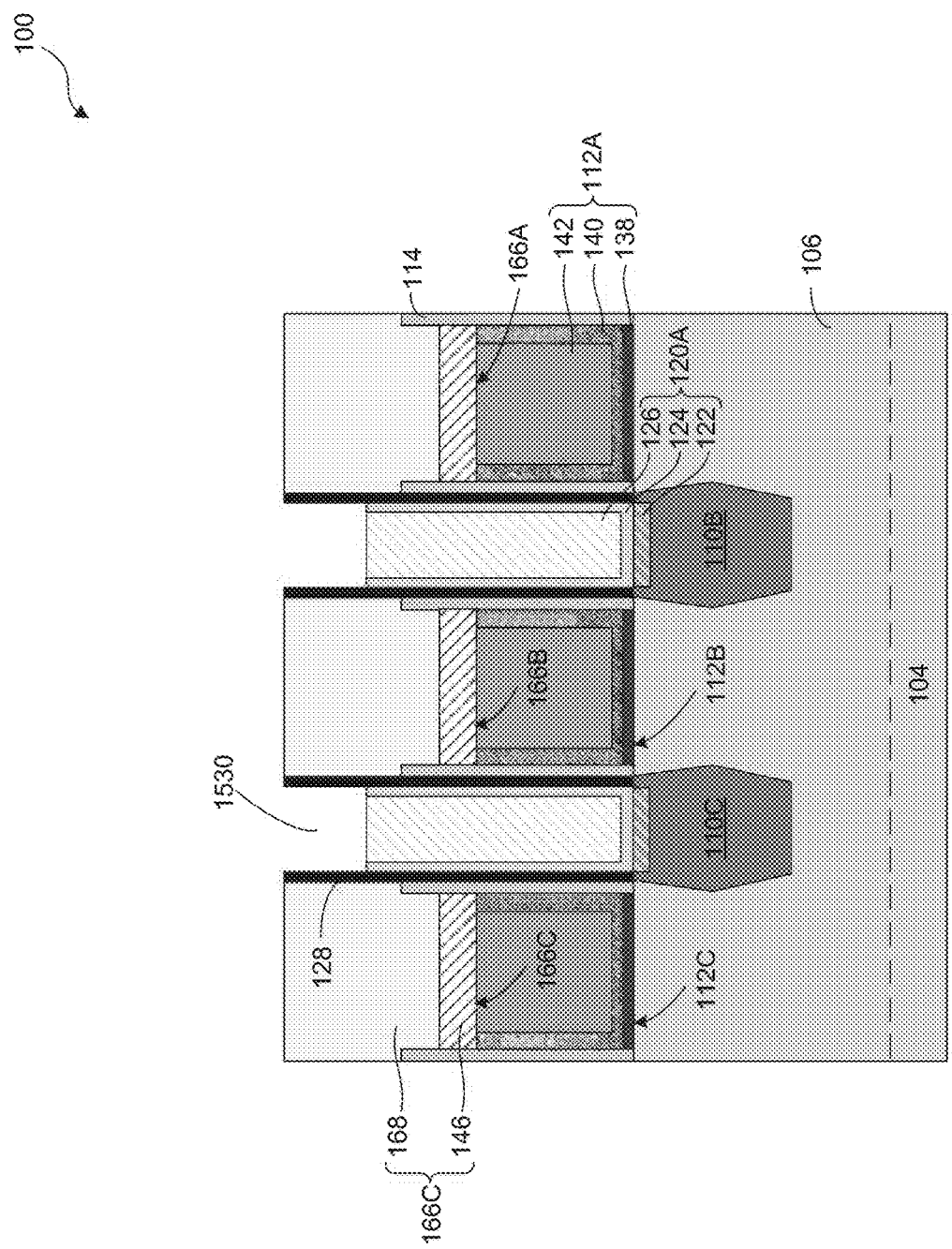
Figure 27:
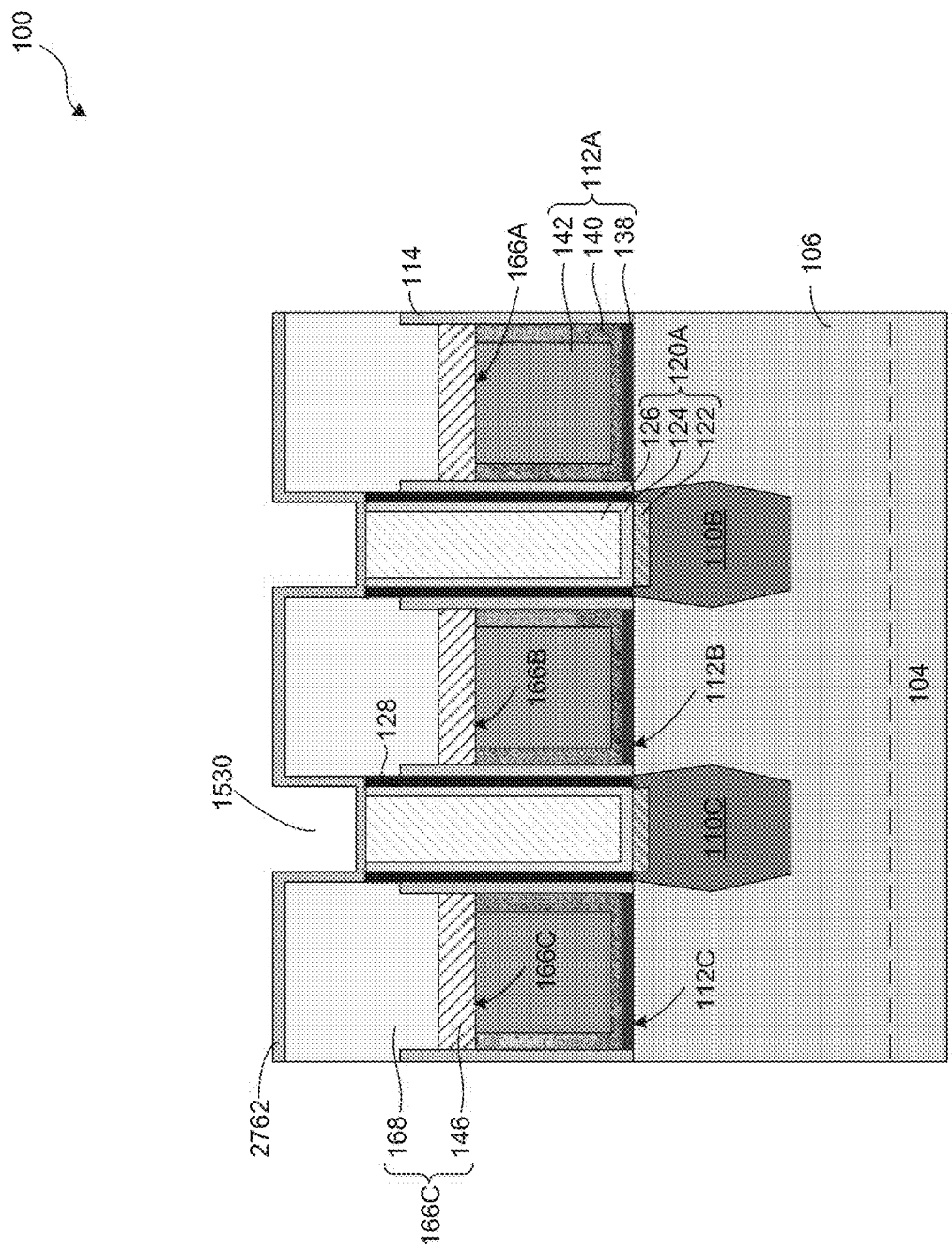
Figure 28:
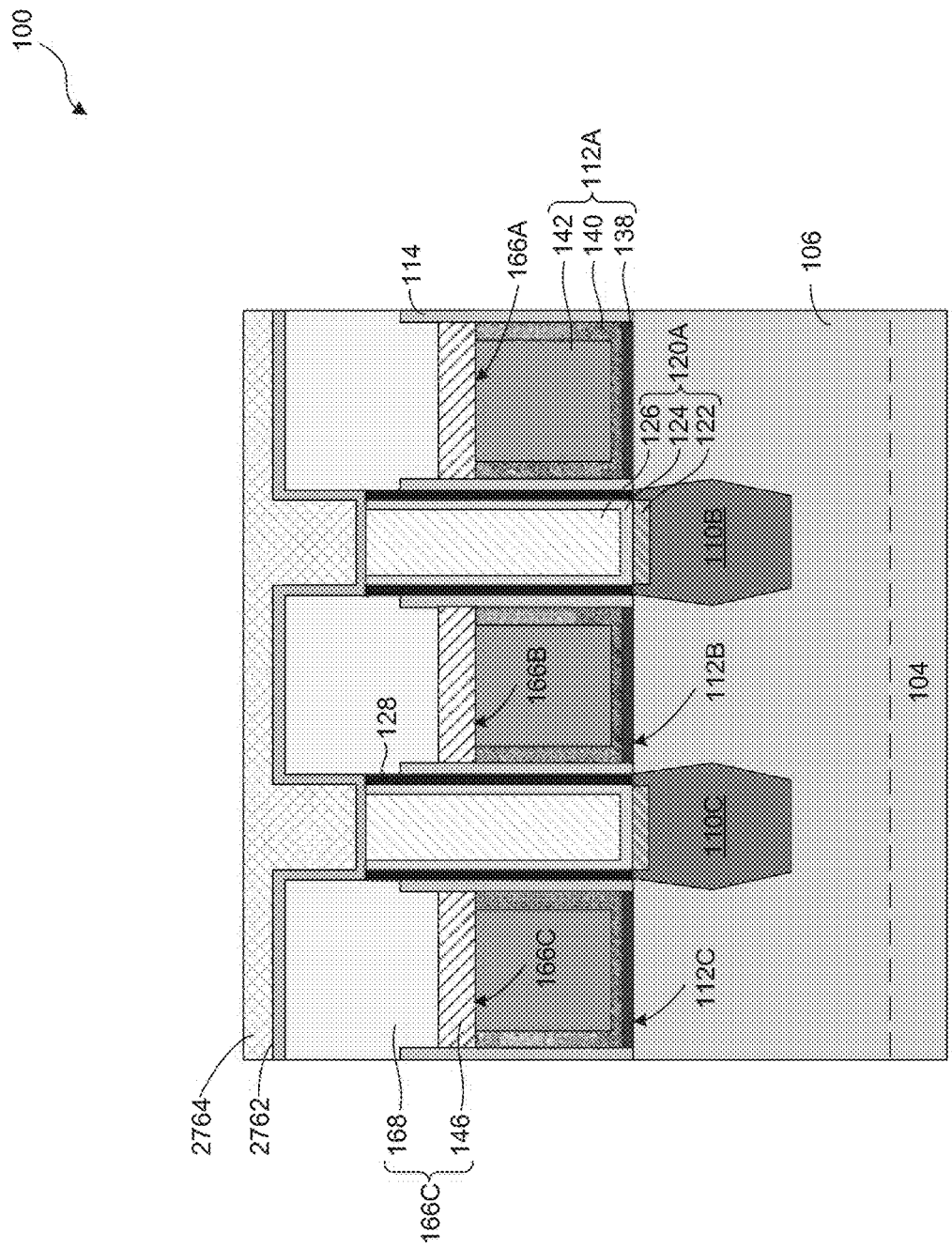
Figure 28:
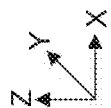
Figure 29:
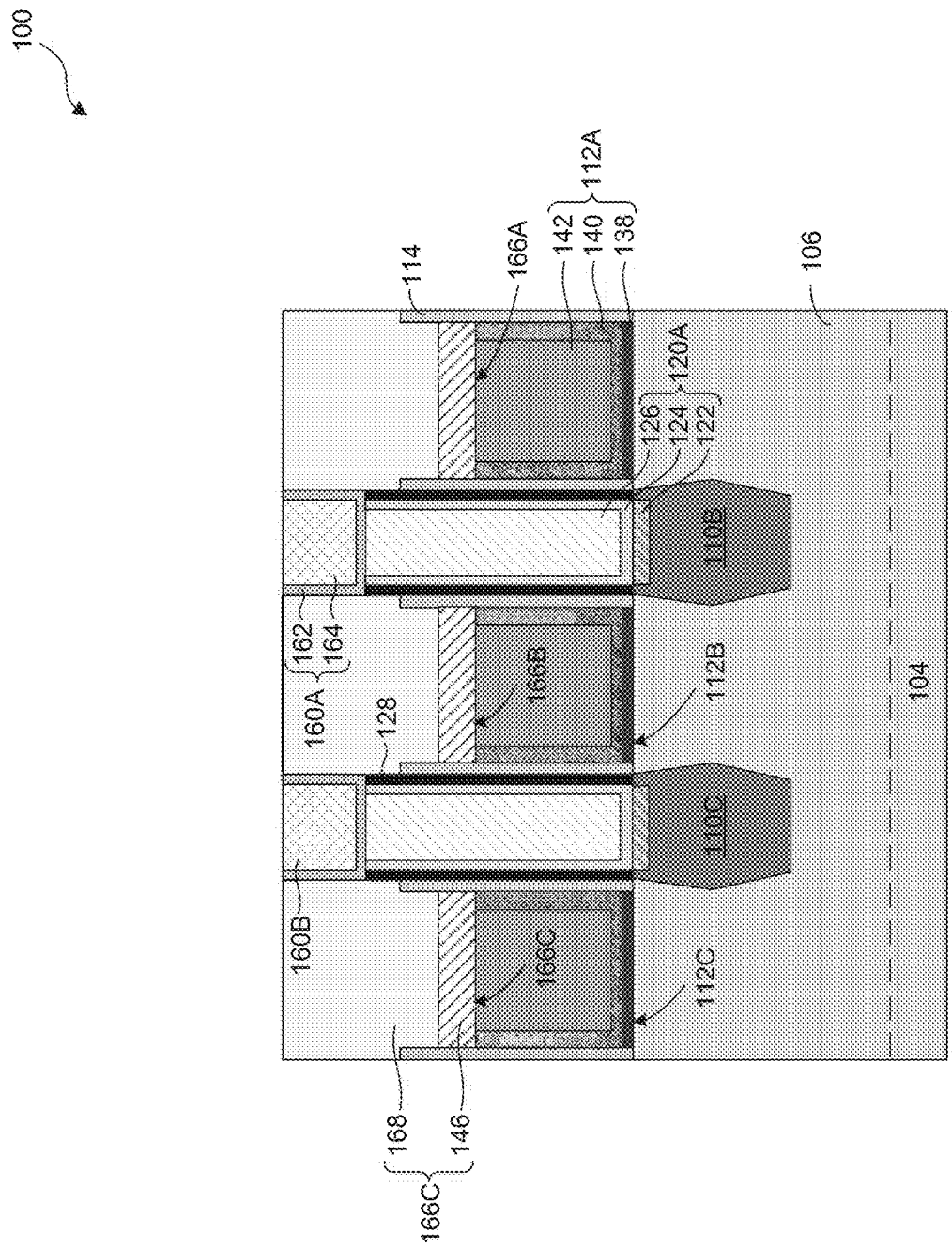

Referring to FIG. 24, in operation 2425, S/D capping structures are formed on the S/D contact structures. For example, as described with reference to FIGS. 26-29, S/D capping structures 160A-16B are formed on S/D contact structures 120A-120B. The formation of S/D capping structures 160A-16B can include sequential operations of (i) etching portions of S/D contact structures 120A-120B to form S/D cap openings 1530, as shown in FIG. 26, (ii) depositing a metal nitride layer 2762 on the structure of FIG. 26 to form the structure of FIG. 27, (iii) depositing a carbide layer 2764 with a carbon atom concentration ranging from about 30 atomic % to about 50 atomic % on the structure of FIG. 27 to form the structure of FIG. 28, and (iv) performing a CMP process on the structure of FIG. 28 to form the structure of FIG. 29.

Figure 30:
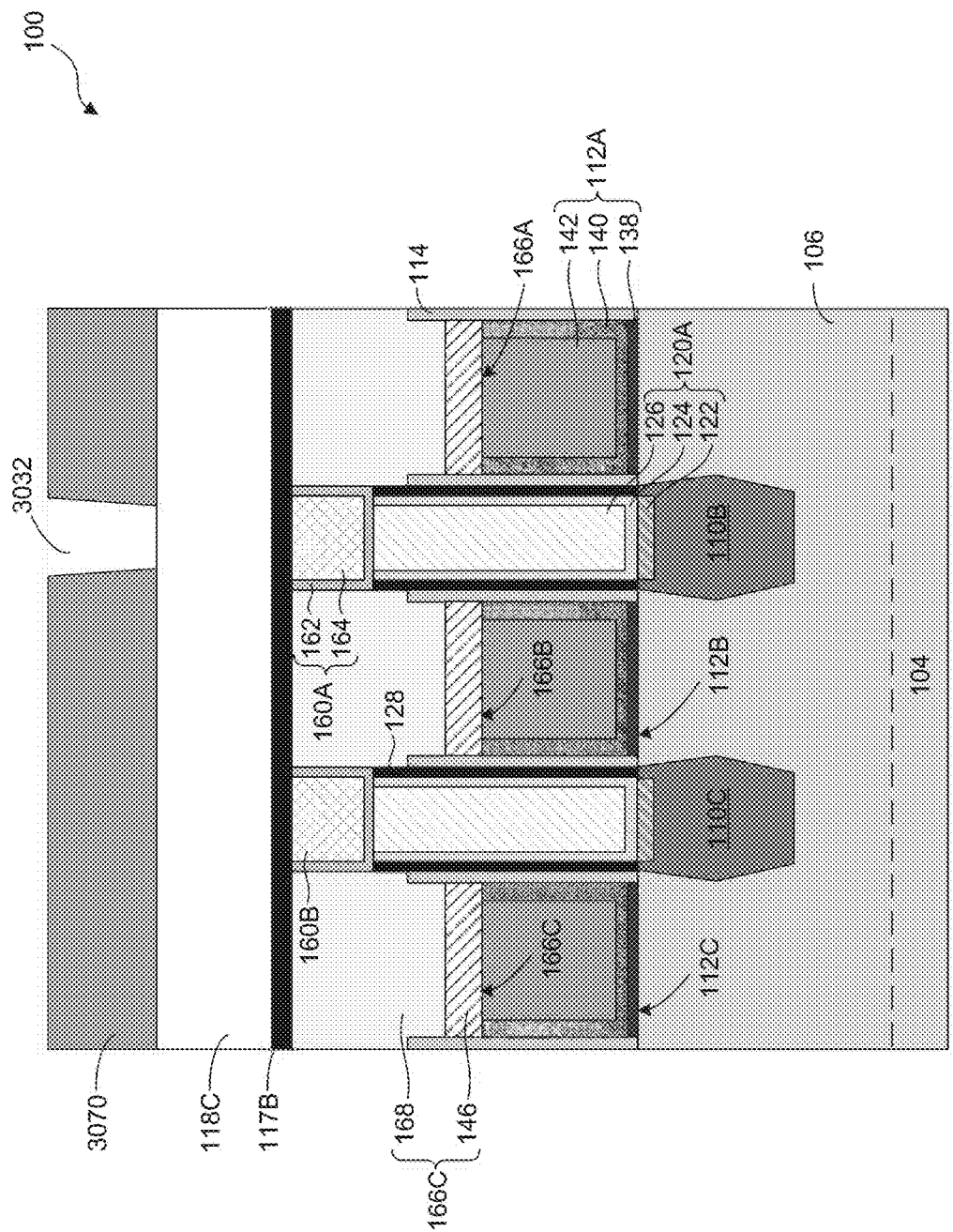
Figure 31:
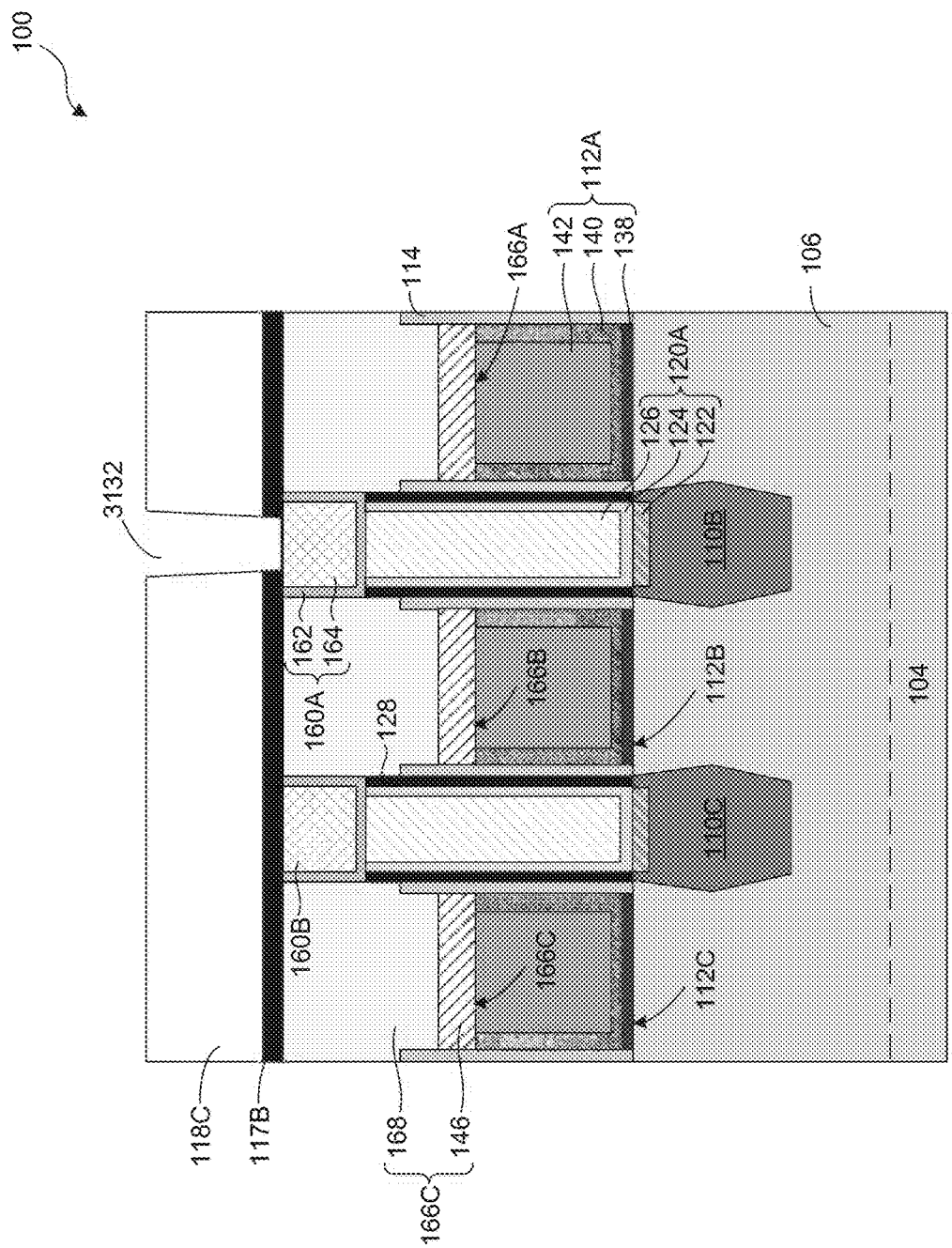
Figure 32:
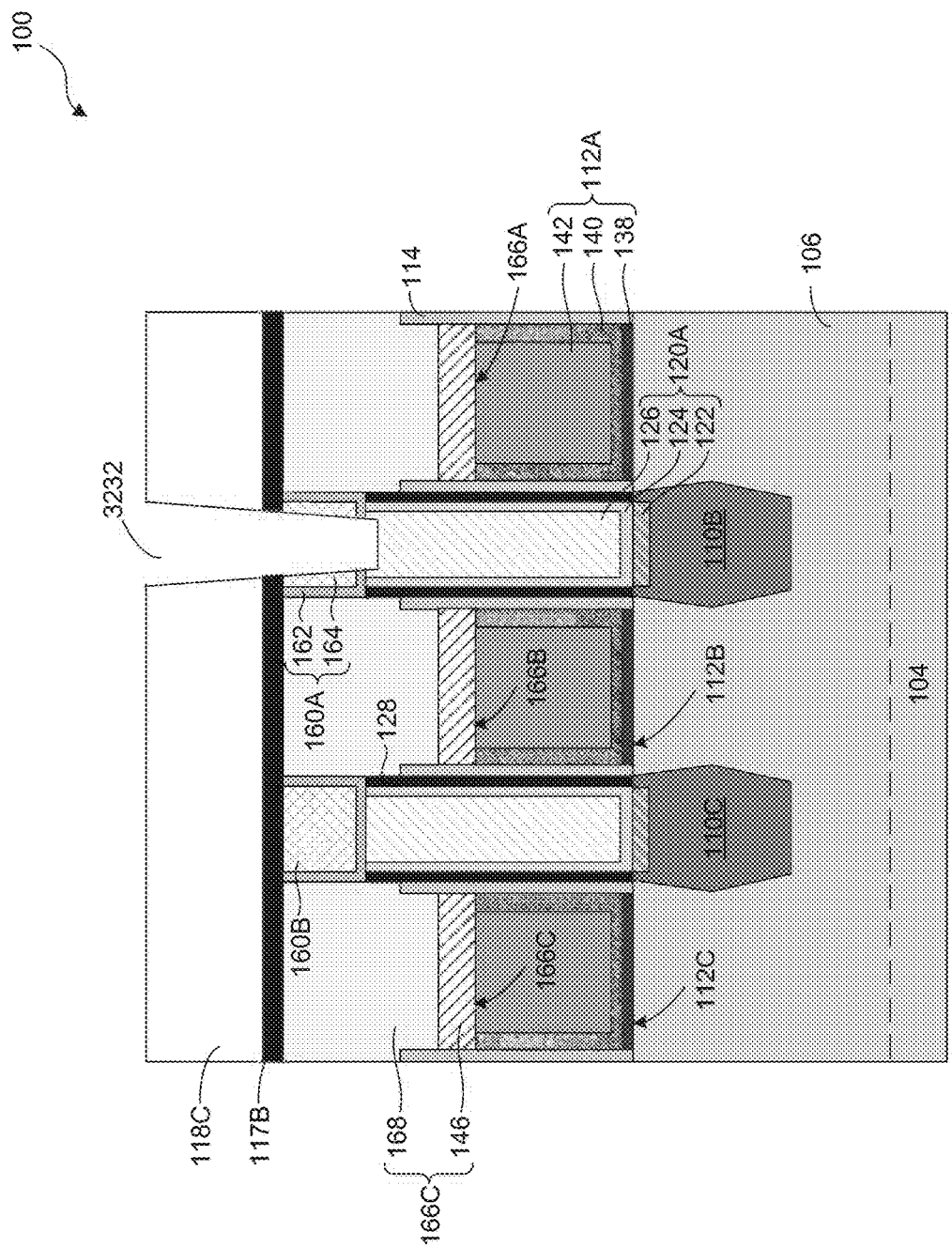

Referring to FIG. 24, in operation 2430, a via opening is formed on one of the S/D contact structures. For example, as described with reference to FIGS. 30-32, a via opening 3232 is formed on S/D contact structure 120A. The formation of via opening 3232 can include sequential operations of (i) depositing a masking layer 3070 on the structure of FIG. 29, (ii) performing a first etching process to form opening 3032 within masking layer 3070 and aligned with S/D capping structure 160A and S/D contact structure 120A, as shown in FIG. 30, (iii) performing a second etching process to remove portions of ILD layer 118C and ESL 117B underlying opening 3032 to extend opening 3032 into ESL 117B and form opening 3232, as shown in FIG. 31, and (iv) performing a third etching process to remove portions of carbon-based S/D cap 164, S/D cap liner 162, and contact plug 126 underlying opening 3132 to extend opening 3132 into contact plug 126 and form via opening 3232, as shown in FIG. 32. The discussion of the first, second, and third etching processes in operation 230 applies to the first, second, and third etching processes in operation 2430 unless mentioned otherwise.

Figure 33:
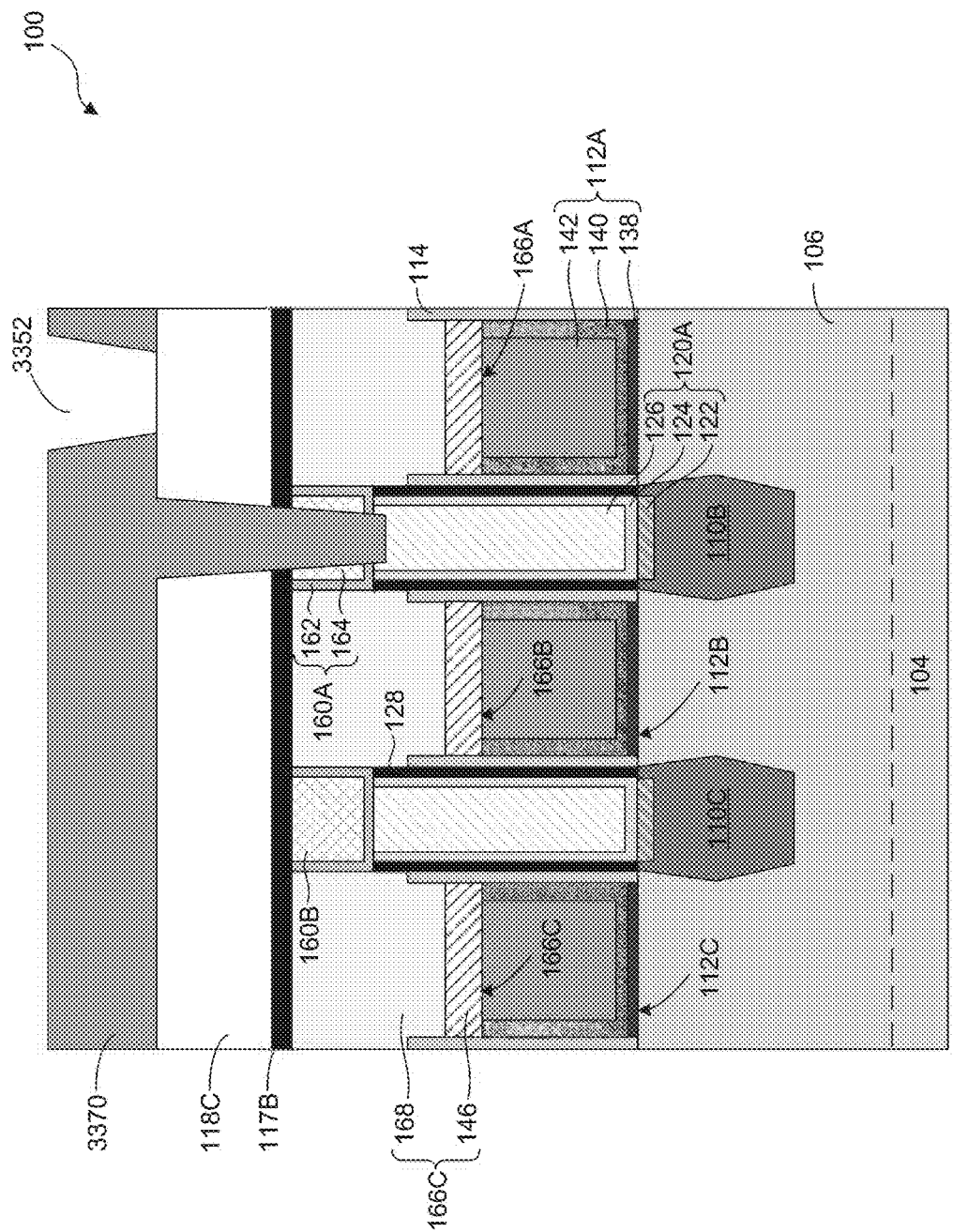

Referring to FIG. 24, in operation 2435, a gate contact opening is formed on one of the gate capping structures. For example, as described with reference to FIGS. 33-34, a gate contact opening 3452 is formed on conductive gate cap 146 of gate capping structure 166A. The formation of gate contact opening 3452 can include sequential operations of (i) depositing a masking layer 3370 on the structure of FIG. 32, (ii) performing a first etching process to form opening 3352 within masking layer 3370 and aligned with gate capping structure 166A, as shown in FIG. 33, and (iii) performing a second etching process to remove portions of ILD layer 118C, ESL 117B, gate insulating cap 168, and conductive gate cap 146 underlying opening 3352 to extend opening 3352 into conductive gate cap 146 and form gate cap opening 3452, as shown in FIG. 34.

In some embodiments, the second etching process can include sequential operations of (i) etching the portions of ILD layer 118C with an etching gas mixture of $CH_3F$ and oxygen, (ii) etching the portions of ESL 117B with an etching gas mixture of $C_4F_6$ and oxygen, (iii) etching the portions of gate insulating cap 168 with the etching gas mixture of $CH_3F$ and oxygen, and (iv) etching the portions of conductive gate cap 146 with the etching gas mixture of $NF_3$ and oxygen and/or sulfur hexafluoride ($SF_6$) and oxygen.

Figure 35:
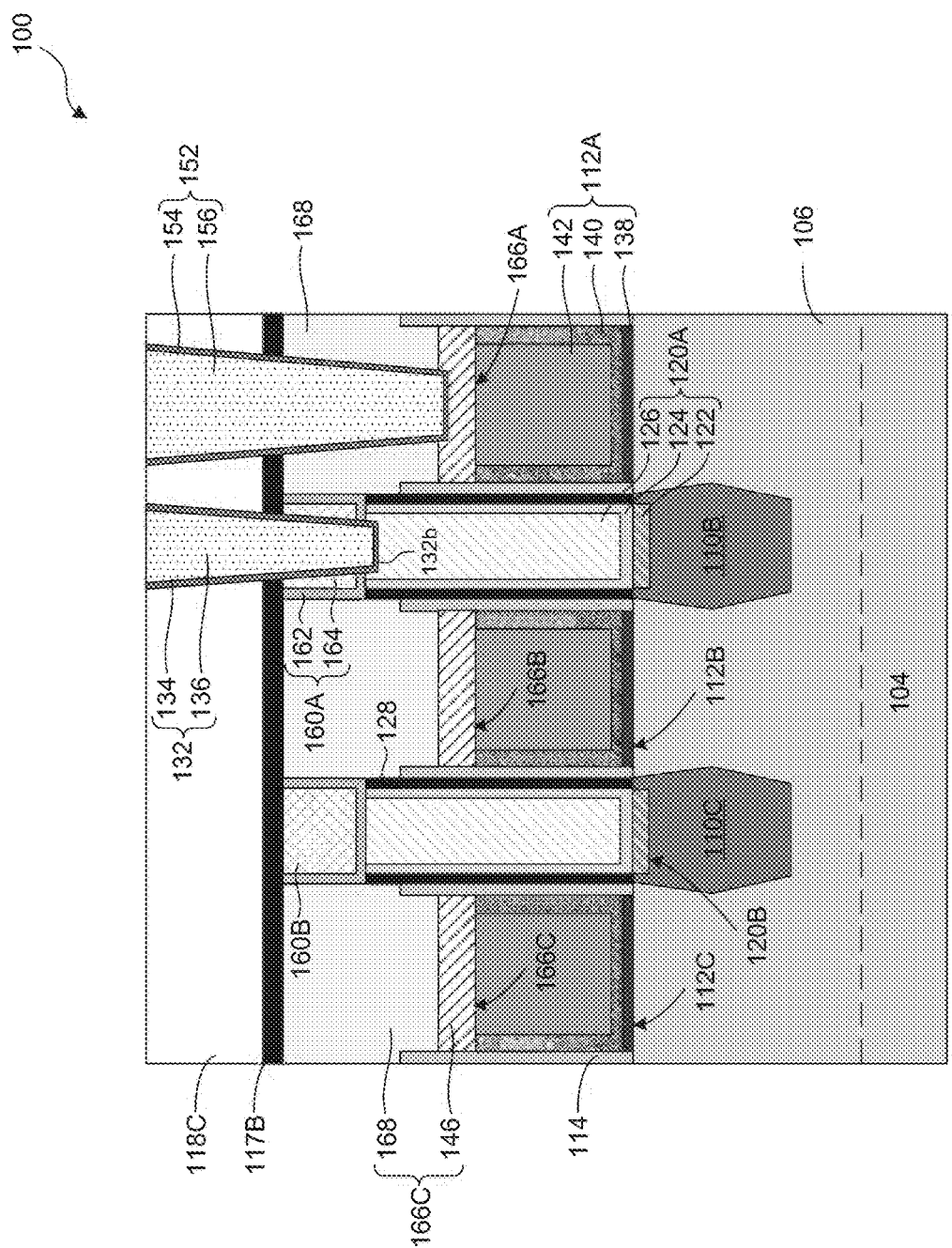

Referring to FIG. 24, in operation 2440, a gate contact structure is formed on one of the gate structures and a via is formed on one of the S/D contact structures. For example, as shown in FIG. 35, gate contact structure 152 is formed on gate structure 112A and via 132 is formed on S/D contact structure 120A. The process for forming gate contact structures 152 and via 132 can be similar to the processes described in operation 240.

The present disclosure provides example semiconductor devices (e.g., FET 100) with source/drain (S/D) capping structures (e.g., S/D capping structures 130A-130B and 160A-160B) and gate capping structures (e.g., gate capping structures 144A-144C and 166A-166C) that facilitate the alignment of vias (e.g., via 132) and contact structures (e.g., gate contact structure 152) on S/D regions (e.g., S/D region 110B) and gate structures (e.g., gate structure 112A). Further, the present disclosure provides example methods (e.g., methods 200 and 2400) of selectively forming the vias and contact structures on S/D regions and gate structures through the S/D and gate capping structures with minimal or no misalignment. Since the vias on S/D regions and contact structures on gate structures can be adjacent to each other, misalignment of the vias and/or contact structures can result in undesirable parasitic capacitances and/or electrical short between the vias, the contact structures, and/or the gate structures.

In some embodiments, the S/D and gate capping structures are formed with different materials that have ultra-high etch selectivity with respect to each other in wet or dry etching processes. In some embodiments, the S/D capping structures (e.g., S/D capping structures 130A-130B) can include nitrides or oxides and the gate capping structures (e.g., gate capping structures 144A-144C) can include carbon-based materials (e.g., carbides or oxycarbides). In some embodiments, the etching processes can be optimized for carbide to nitride or oxide etch selectivity ranging from about 40 to about 70. The ultra-high carbide to nitride or oxide etch selectivity can prevent or minimize etching of adjacent S/D capping structures during the formation of contact structures through the gate capping structures. As a result, the contact structures can be formed with minimal or no misalignment on the gate structures.

In some embodiments, a method includes forming a fin structure on a substrate, forming a source/drain (S/D) region on the fin structure, forming a gate structure on the fin structure adjacent to the S/D region, and forming a capping structure on the gate structure. The forming the capping structure includes forming a conductive cap on the gate structure, forming a cap liner on the conductive cap, and forming a carbon-based cap on the cap liner. The method further includes forming a first contact structure on the S/D region, forming an insulating cap on the first contact structure, and forming a second contact structure on the conductive cap.

In some embodiments, a method includes forming a fin structure on a substrate, forming a source/drain (S/D) region on the fin structure, forming a gate structure on the fin structure adjacent to the S/D region, forming a first contact structure on the S/D region, and forming a first capping structure on the first contact structure. The forming first capping structure includes forming a cap liner on the first contact structure and forming a carbon-based cap on the cap liner. The method further includes forming a second capping structure on the gate structure, forming and forming a second contact structure on the conductive cap. The forming the second capping structure includes forming a conductive cap on the gate structure and forming an insulating cap on the conductive cap.

In some embodiments, a semiconductor device includes a substrate, a fin structure disposed on a substrate, a source/drain (S/D) region disposed on the fin structure, a gate structure disposed on the fin structure adjacent to the S/D region, a gate capping structure disposed on the gate structure, a first contact structure disposed on the S/D region, an insulating cap disposed on the contact structure, and a second contact structure disposed on the conductive cap. The gate capping structure includes a conductive cap disposed on the gate structure, a cap liner disposed on the conductive cap, and a carbon-based cap disposed on the cap liner.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a gate structure disposed on the substrate;
   a first capping structure disposed on the gate structure, wherein the first capping structure comprises:
   a metallic cap disposed on the gate structure,
   a cap liner disposed on the metallic cap, and
   a carbon-based cap disposed on the cap liner; and
   a first contact structure disposed in the metallic cap.

2. The semiconductor device of claim 1, further comprising:
   a second contact structure disposed on a S/D region; and
   a second capping structure disposed on the second contact structure.

3. The semiconductor device of claim 2, further comprising a via structure disposed in the second capping structure and in the second contact structure, wherein the second capping structure comprises an insulating nitride cap.

4. The semiconductor device of claim 2, further comprising a via structure disposed in the second capping structure, wherein the second capping structure comprises a conductive cap.

5. The semiconductor device of claim 2, wherein the carbon-based cap comprises a carbon-based material with an etch selectivity higher than an etch selectivity of a material of the second capping structure.

6. The semiconductor device of claim 2, wherein the carbon-based cap comprises a carbide layer with an etch selectivity of about 40 times to about 70 times higher than an etch selectivity of a material of the second capping structure.

7. The semiconductor device of claim 1, wherein the cap liner comprises a metal nitride layer disposed on the metallic cap.

8. The semiconductor device of claim 1, wherein the carbon-based cap comprises a carbide layer disposed on the cap liner.

9. The semiconductor device of claim 1, wherein the carbon-based cap comprises a carbide layer with a carbon atom concentration of about 30 atomic % to about 50 atomic %.

10. The semiconductor device of claim 1, wherein the carbon-based cap comprises a material with carbon and oxygen atoms or with carbon and nitrogen atoms, and
wherein a concentration of the carbon atoms is greater than a concentration of the oxygen atoms and a concentration of the nitrogen atoms.

11. A semiconductor device, comprising:
a substrate;
a source/drain (S/D) region disposed on the substrate;
a first contact structure disposed on the S/D region;
a first capping structure disposed on the first contact structure, wherein the first capping structure comprises:
a cap liner disposed on the first contact structure, and
a carbon-based cap disposed on the cap liner; and
a via structure disposed in the first capping structure and in the first contact structure.

12. The semiconductor device of claim 11, further comprising:
a second capping structure disposed on a gate structure; and
a second contact structure disposed in the second capping structure.

13. The semiconductor device of claim 12, wherein the second capping structure comprises:
a metallic cap disposed on the gate structure, and
an insulating cap disposed on the metallic cap.

14. The semiconductor device of claim 11, wherein the cap liner comprises a metal nitride layer disposed on the first contact structure.

15. The semiconductor device of claim 12, wherein the carbon-based cap comprises a carbon-based material with an etch selectivity higher than an etch selectivity of a material of the second capping structure.

16. The semiconductor device of claim 11, wherein a ratio between a thickness of the cap liner and a thickness of the carbon-based cap is about 1:3 to about 1:15.

17. A method, comprising:
forming a gate structure between gate spacers on a substrate;
etching the gate structure to expose inner sidewalls of the gate spacers;
depositing a first conductive layer on the gate structure and on the inner sidewalls of the gate spacers;
depositing a metal nitride layer on the first conductive layer;
depositing a carbon-based layer on the metal nitride layer;
etching the first conductive layer, the metal nitride layer, and the carbon-based layer to form an opening; and
depositing a second conductive layer in the opening.

18. The method of claim 17, further comprising performing a polishing process to coplanarize top surfaces of the metal nitride layer and the carbon-based layer.

19. The method of claim 17, further comprising forming a contact structure on a source/drain region on the substrate.

20. The method of claim 19, further comprising:
depositing an insulating layer on the contact structure and on the carbon-based layer, and
performing a polishing process to coplanarize top surfaces of the insulating layer and the carbon-based layer.

* * * * *

UNITED STATES PATENT AND TRADEMARK OFFICE
CERTIFICATE OF CORRECTION

PATENT NO. : 12,094,951 B1
APPLICATION NO. : 18/136493
DATED : September 17, 2024
INVENTOR(S) : Chang et al.

It is certified that error appears in the above-identified patent and that said Letters Patent is hereby corrected as shown below:

In the Specification

In Column 2, Line 11, delete "case" and insert -- ease --, therefor.

In Column 2, Line 18, delete "heroin" and insert -- herein --, therefor.

In Column 6, Line 50, delete "cerium (Cc)," and insert -- cerium (Ce), --, therefor.

In Column 6, Line 50, delete "prascodymium" and insert -- praseodymium --, therefor.

In Column 8, Line 13, delete "MON," and insert -- MoN, --, therefor.

In the Claims

In Column 18, Claim 20, Line 29, delete "layer," insert --layer; -- therefor.

Signed and Sealed this
Twenty-second Day of October, 2024

*Katherine Kelly Vidal*

Katherine Kelly Vidal
*Director of the United States Patent and Trademark Office*